United States Patent
Iijima

(10) Patent No.: US 6,765,271 B2
(45) Date of Patent: Jul. 20, 2004

(54) METHOD FOR MANUFACTURING NON-VOLATILE SEMICONDUCTOR MEMORY AND NON-VOLATILE SEMICONDUCTOR MEMORY MANUFACTURED THEREBY

(75) Inventor: Mitsuteru Iijima, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/237,805

(22) Filed: Sep. 10, 2002

(65) Prior Publication Data

US 2003/0008488 A1 Jan. 9, 2003

Related U.S. Application Data

(62) Division of application No. 09/738,760, filed on Dec. 18, 2000, now Pat. No. 6,468,861.

(30) Foreign Application Priority Data

Mar. 10, 2000 (JP) .......................................... 2000-66014
Aug. 14, 2000 (JP) ........................................ 2000-245859

(51) Int. Cl.[7] .............................................. H01L 29/76
(52) U.S. Cl. ....................... 257/390; 257/324; 257/326; 257/331; 257/314; 257/316; 257/411; 257/315
(58) Field of Search ................................. 257/390, 314, 257/315, 316, 324, 326, 331, 411

(56) References Cited

U.S. PATENT DOCUMENTS

| | | | |
|---|---|---|---|
| 5,891,773 A | 4/1999 | Saitoh | 439/259 |
| 5,959,328 A | 9/1999 | Krautschneider et al. | 257/314 |
| 6,008,087 A | 12/1999 | Wu | 438/257 |
| 6,346,725 B1 | 2/2002 | Ma et al. | 257/316 |
| 6,445,046 B1 * | 9/2002 | Hofmann et al. | 257/390 |
| 6,468,861 B2 * | 10/2002 | Iijima | 43/257 |

FOREIGN PATENT DOCUMENTS

JP 2-231772 9/1990

* cited by examiner

Primary Examiner—Matthew Smith
Assistant Examiner—Igwe U. Anya
(74) Attorney, Agent, or Firm—Westerman, Hattori, Daniels & Adrian, LLP

(57) ABSTRACT

The present invention is a method for manufacturing a non-volatile semiconductor memory cell of a structure provided with a trap gate between a word line serving as a control gate, and a channel region of a substrate, the trap gate is constructed of an insulating layer and capable of trapping a carrier. The trap gate constructed of the insulating layer can change a threshold of a transistor locally because the carriers injected and trapped inside do not move in the gate. As associated with it, the trap gate does not need to be separated between adjacent memory cells. In addition, the insulating layers for electrical isolation need to be formed on and under the trap gate constructed of the insulating layer. However, the gate insulating layer of the three-layers structure can be formed very thin and highly reliably compared with the conventional floating gate structure. According to the present invention, the manufacturing method comprises the steps of forming a striped pattern extending in the word line direction; depositing an insulating film on the striped pattern and then forming a side wall insulating film on both side walls of the striped pattern by etching the surface throughout; selectively removing the striped pattern and then depositing a gate insulating film including a trap gate insulating film on an exposed substrate; and depositing a conductive layer throughout on the surface and removing the upper part of the conductive layer except for a region between the side wall insulating films. Consequently, the conductive layer between the side wall insulating films becomes the word line.

4 Claims, 22 Drawing Sheets

|  | Write | Erase | Read |
|---|---|---|---|
| BL1 | 0V | Open | 3V |
| BL2 | 0V | Open | 3V |
| BL3 | 6V | 6V | 0V |
| BL4 | 6V | Open | 0V |
| WL1 | 0V | −5V or Open | 0V |
| WL2 | 12V | −5V or Open | 3V |
| WL3 | 0V | −5V or Open | 0V |

A-A' Sectional View a)

b)

c)

d)

e)

f)

A-A' Sectional View

B1-B1' Sectional View

B1-B1' Sectional View e)

f)

A-A' Sectional View

A-A' Sectional View

B1-B1' Sectional View

B1-B1' Sectional View f)

i)

j)

B2-B2' Sectional View j')

METHOD FOR MANUFACTURING NON-VOLATILE SEMICONDUCTOR MEMORY AND NON-VOLATILE SEMICONDUCTOR MEMORY MANUFACTURED THEREBY

This application is a Divisional of application No.09/738,760 filed Dec. 18, 2000 now U.S. Pat. No. 6,468,861.

BACKGROUND OF THE INVENTION

1. Field of the Invention

The present invention relates to a method for manufacturing a non-volatile semiconductor memory of high density and high reliability and to a novel structure of the non-volatile semiconductor memory formed thereby.

2. Description of the Related Art

In the non-volatile semiconductor memory, the most wide-spreading configuration is a flash memory or EEPROM constructed of a non-volatile semiconductor memory cell having a floating gate and a control gate on the channel region of a transistor. A problem of this non-volatile semiconductor memory is that a memory capacity cannot be increased.

In order to increase the memory capacity, Japanese Laid Open Patent H02-231772 A, for example, proposes that a memory cell transistor be formed more densely. According to this prior art, a plurality of rows of a first floating gate layer and a first word line layer serving as a control gate are arranged so as to intersect a bit line defused layer formed in a striped shape. Between the arrangements of the first floating gate layer and the first word line layer, a second floating gate layer is formed and then a second word line layer serving as a control gate is formed thereon. The floating gate type non-volatile semiconductor memory of this configuration forms the second floating gate layer and the second word line layer between the first floating gate layer and the first word line layer adjacent each other so that the memory cell can be formed more high-densely compared with the conventional case of arranging a plurality of rows of the first floating gate layer and the first word line layer. That is, the doubled number of word lines can be arranged in the same area without changing a design rule.

A manufacturing method described in this prior art comprises:

(1) a process for forming a first layer polycrystalline silicon film in a pattern having a plurality of stripe shapes by depositing the first layer polycrystalline silicon film on a first conductive type semiconductor substrate through an insulating film;

(2) a process for forming a wiring layer in a plurality of stripe shapes by defusing impurities using the first layer polycrystalline silicon film pattern-formed as a mask;

(3) a process for forming a plurality of first word lines and a first floating gate, the first floating gate being self-aligned therewith and arranged thereunder, by forming an insulating film on said first layer polycrystalline silicon film to deposit a second layer polycrystalline silicon film throughout thereon and by selectively etching the second layer polycrystalline silicon film and then the first layer polycrystalline silicon film using a stripe-shaped pattern mask, the stripe in the mask running in the direction intersecting said wiring layer;

(4) a process for forming a third layer polycrystalline silicon film so as to intersect the first word lines and to overlap the first floating gate by depositing the third layer polycrystalline silicon film on said first word lines through an insulating film; and (5) a process for forming a plurality of second word lines and a second floating gate, the second floating gate being self-aligned therewith and arranged thereunder, by forming an insulating film on said third layer polycrystalline silicon film to deposit a fourth layer polycrystalline silicon film throughout thereon and by selectively etching the fourth layer polycrystalline silicon film and then the third layer polycrystalline silicon film using a stripe-shaped pattern mask that overlaps said first word lines.

According to this manufacturing method, the two-layer structures constructed of the second word line and the second floating gate are further inserted between the two-layer structures constructed of the first word line and the first floating gate in the lateral direction. Thereby, the doubled density of the memory cells is practically realized with the conventional pitch of the first word lines maintained.

The operation of this floating gate type non-volatile memory has a data writing (program) mode and a batch-erasing mode. The data writing mode is conducted by applying a predetermined voltage on a selected pair of adjacent bit lines and a selected word line to inject hot electrons into the floating gate from the substrate. The batch-erasing mode is conducted by applying a high voltage on all the bit lines to emit electrons in the floating gate to the substrate by a tunnel current. In addition, a reading operation is conducted by applying a predetermined voltage on the word line and one of the bit lines to detect the differences in threshold voltages caused by whether electrons are injected in the floating gate through a cell transistor carrying or not carrying the current.

First, in the conventional manufacturing method described above, the respective first and second floating gates and the respective first and second word lines have to be formed separately so that the number of steps are increased to rise manufacturing costs. Furthermore, a problem is raised that the memory cell characteristics constructed of the first word line are different from those of the second word line because of their different structures.

Secondly, in the conventional manufacturing method, resulting from line width differences between the first and second word lines, a problem is raised that the memory cell characteristics of the memory cell constructed of the first word lines are different from those of the second word lines. In this case, a problem is raised that the distance between the first word lines must be expanded more than the minimum fabrication dimensions thus a memory cell is prevented from being highly dense.

Thirdly, in the conventional manufacturing method, the first and second word lines are formed by masks of a different pattern. Consequently, characteristic failure is generated due to alignment shifts between the masks so that the yield of products or reliability is deteriorated. In particular, a capacitance ratio of the capacitance between the word line as the control gate and the floating gate to the capacitance between the floating gate and the substrate greatly affects the characteristics of the memory cell. However, this capacitance ratio largely depends on the alignment accuracy during the lithography process for patterning the first and second word lines. Accordingly, it is difficult to uniform the characteristics of the memory cells with excellent repeatability.

Fourthly, in the conventional manufacturing method, the planarization is not performed because the second word line is formed over the top of the first word line. Then following metal wiring becomes difficult. Thus, a problem is raised that the yield of products or reliability is deteriorated.

SUMMARY OF THE INVENTION

It is therefore the object of the present invention to solve the conventional problems described above and to provide a method for manufacturing a non-volatile semiconductor memory highly integrated, highly reliable, easily manufactured and low-cost and the non-volatile semiconductor memory manufactured thereby.

In order to achieve the object mentioned above, the present invention is a method for manufacturing a non-volatile semiconductor memory cell of a structure provided with a trap gate between a word line serving as a control gate, and a channel region of a substrate, the trap gate is constructed of an insulating layer and capable of trapping a carrier. The trap gate constructed of the insulating layer can change a threshold of a transistor locally because the carriers injected and trapped inside do not move in the gate. As associated with it, the trap gate does not need to be separated between adjacent memory cells. In addition, the insulating layers for electrical isolation need to be formed on and under the trap gate constructed of the insulating layer. However, the gate insulating layer of the three-layers structure can be formed very thin and highly reliably compared with the conventional floating gate structure.

According to a first aspect of the present invention, the manufacturing method comprises the steps of forming a striped pattern extending in the word line direction; depositing an insulating film on the striped pattern and then forming a side wall insulating film on both side walls of the striped pattern by etching the surface throughout; selectively removing the striped pattern and then depositing a gate insulating film including a trap gate insulating film on an exposed substrate; and depositing a conductive layer throughout on the surface and removing the upper part of the conductive layer except for a region between the side wall insulating films. Consequently, the conductive layer between the side wall insulating films becomes the word line.

In accordance with this process, after the striped pattern is formed with the minimum line width accuracy, a plurality of word lines insulated and isolated by the side wall insulating films can be formed by the self alignment. Furthermore, a gate insulating film structure including the trap gate insulating film can be formed between the word line and the substrate. This trap gate insulating film does not need to be separated between adjacent cell transistors and a conventional mask alignment is unnecessary.

According to a second aspect of the present invention, the manufacturing method comprises the steps of depositing a gate insulating film including a trap gate insulating film on a substrate; forming a conductive striped pattern extending in the word line direction thereon; forming a side wall insulating film by oxidizing the side wall of the conductive striped pattern; again depositing a gate insulating film including a trap gate insulating film on the substrate exposed between the side wall insulating films; and depositing a conductive layer thereon and removing the upper part of the conductive layer except for a region between the side wall insulating films. Therefore, a highly dense memory cell array structure is formed in which the conductive striped pattern is a first word line and the conductive layer between the side wall insulating films is a second word line.

According to the manufacturing method described above, after the conductive striped pattern is formed with the minimum line width accuracy, the side wall insulating films and the conductive layer therebetween can be formed by the self alignment. Among the conductive striped pattern (first word line), the conductive layer (second word line) and the substrate, a gate insulating film structure including the trap gate insulating film is formed.

According to another aspect of the present invention, a non-volatile semiconductor memory having a plurality of memory cells with an insulative trap gate comprises; a first memory cell array including a gate oxide film deposited on a substrate and having said trap gate insulating film and conductive first word lines formed on the gate oxide film extending in a word line direction; a side wall insulating film for separation disposed on both sides of said first word line; and a second memory cell array including a gate oxide film deposited on said substrate and having said trap gate insulating film and conductive second word lines formed on the gate oxide film, wherein said second word lines are formed by being embedded between the side wall insulating films disposed on both sides of said first word lines. In the semiconductor memory described above, the second word line is embedded between the side wall insulating films for separation disposed on both sides of the first word lines so that the first and second word lines can be disposed highdensely.

In the semiconductor memory of this structure, a more preferred embodiment is characterized in that first and second row decoders for selecting said word line are disposed on both sides of said memory cell array in the said word line direction, said first word line is connected to said first row decoder and said second word line is connected to said second row decoder.

DESCRIPTION OF THE PREFERRED EMBODIMENTS

Presently preferred embodiments of the present invent ion will now be described by way of reference to the accompanying drawings. However, these embodiments will not limit the technical scope of the present invention.

Figures 1, 2:
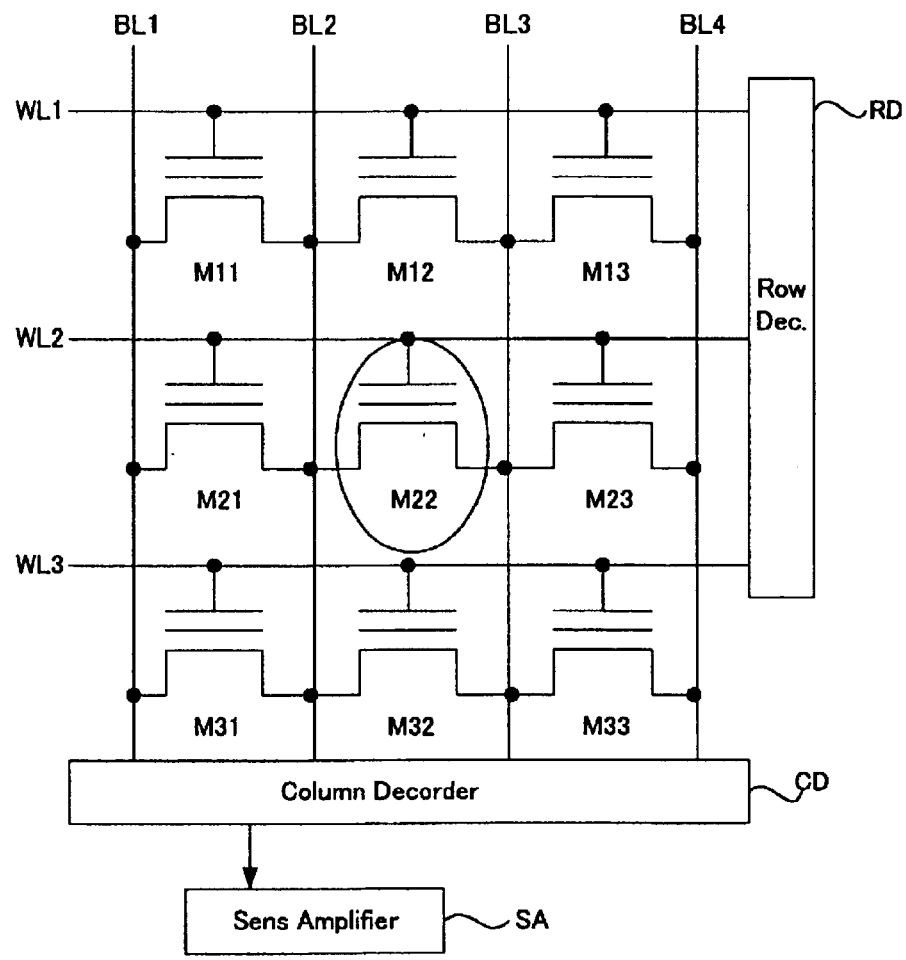
FIG. 1 is a circuit diagram of a non-volatile memory.
FIG. 2 is a chart illustrating the operation of the non-volatile memory.

FIG. 1 illustrates a circuit diagram of a non-volatile semiconductor memory of the embodiment. As shown in FIG. 1, cell transistors M11–M33 having a trap gate are disposed on the intersectional position of word lines WL1–WL3 and bit lines BL1–BL4. The cell transistors M11-M33 are provided between a pair of the bit lines BL. The adjacent transistors share the bit line. Accordingly, one bit line BL2 connected to a cell transistor M22 serves as a source line while the other bit line BL3 serves as a bit line connected to a sense amplifier SA through a column decoder CD. Thereby, operations such as reading and programming (writing) are conducted. In addition, an erasing operation is performed by applying a predetermined voltage between the word line WL2 and the bit lines BL2 and BL3. Furthermore, the word line is selected by a row decoder RD to be applied a voltage corresponding to the respective operations.

FIG. 2 is a chart for illustrating the operation of the memory shown in FIG. 1. The case of a memory cell M22 being selected will now be described. In the writing operation, the bit lines BL1 and BL2 are set 0V, the bit lines BL3 and BL4 are set 6V, the word line WL2 is set 12V and the other word lines WL1 and BL3 are set 0V. Thereby, the channel of the cell transistor M22 is allowed to carry a current and hot electrons generated in the channel are injected on the right side of the trap gate of the cell transistor M22. That is, the hot electrons are injected into the trap gate near the diffused layer of the bit line BL3 side of the cell transistor M22 and the threshold voltage in that region becomes high.

In the reading operation, when the bit lines BL1 and BL2 are set 3V, the bit lines BL3 and BL4 are set 0V and the word line WL2 is set 3V, the cell transistor M22 is applied with an electric field in the direction reverse to the direction when writing. In accordance with the hot electrons having been injected near the diffused layer on the right side of the trap gate, the channel region of the cell transistor M22 is not allowed to carry the current. Not carrying the current to the cell transistor M22 is detected by the sense amplifier SA.

In erasing operation, the bit line BL3 is applied with 6V, the word line WL2 is applied with −5V, and the other bit and word liens are opened. Hot holes are injected on the right side of the trap gate of the cell transistor M22 from the channel region of a substrate to be neutralized with the electrons already injected. Thereby, the threshold voltage on the right side of the channel region returns to the original voltage.

When it is desired to inject the electrons on the left side of the cell transistor M22, only to do is that the bit lines BL1 and BL2 are set 6V and the bit lines BL3 and BL4 are set 0V in the write operation. That is, the electric field is applied in the direction reverse to the case of injecting the electrons on the right side described above. In the reading operation, inversely the case of reading the right side condition, the electric field is applied in the direction from the bit line BL3 to the bit line BL2. Thereby, it can be detected whether the electrons are injected on the left side of the trap gate by the current carried in the cell transistor.

In the cell transistor utilizing the insulative trap gate, the trap gate is insulative so that carriers can be injected locally. Accordingly, when the carriers (hot electrons) are separately injected on the right and left sides, the electric field needs to be applied by manners corresponding to the right and left side injections to read information. Additionally, in the cell transistor utilizing the trap gate, the operation is not impeded even if the trap gate is the insulating layer continuous to the adjacent cell transistor. The trap gate itself is insulative so that the injected carriers cannot move in the trap gate and the carriers are only trapped locally.

Figure 3:
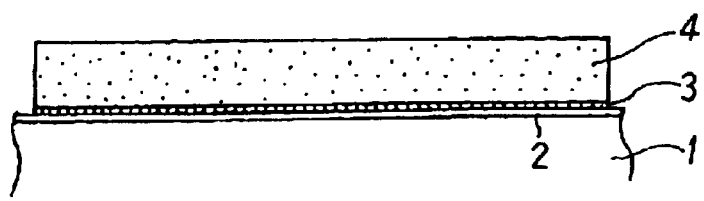
FIG. 3 is a sectional view of a manufacturing process in a first embodiment.
Figure 3:
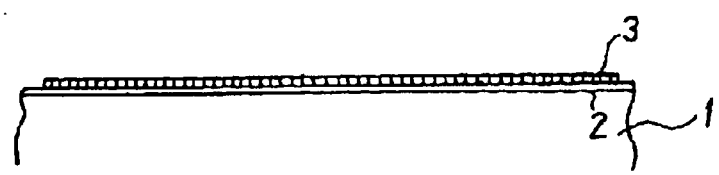
Figure 3:
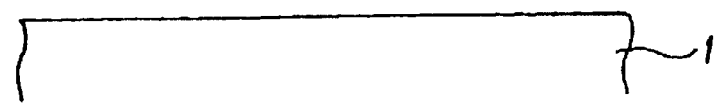
Figure 3:
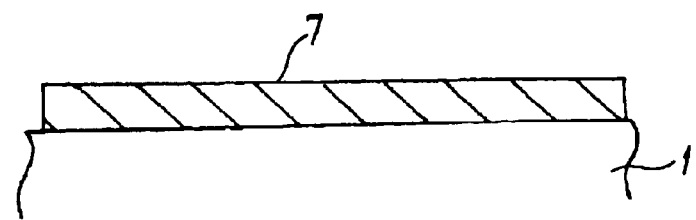
Figure 3:
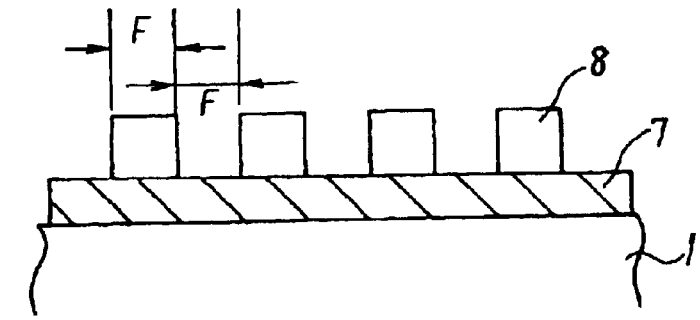
Figure 3:
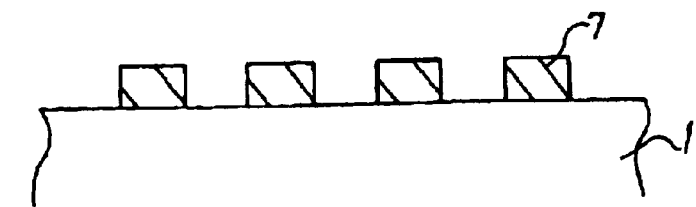
Figure 4:
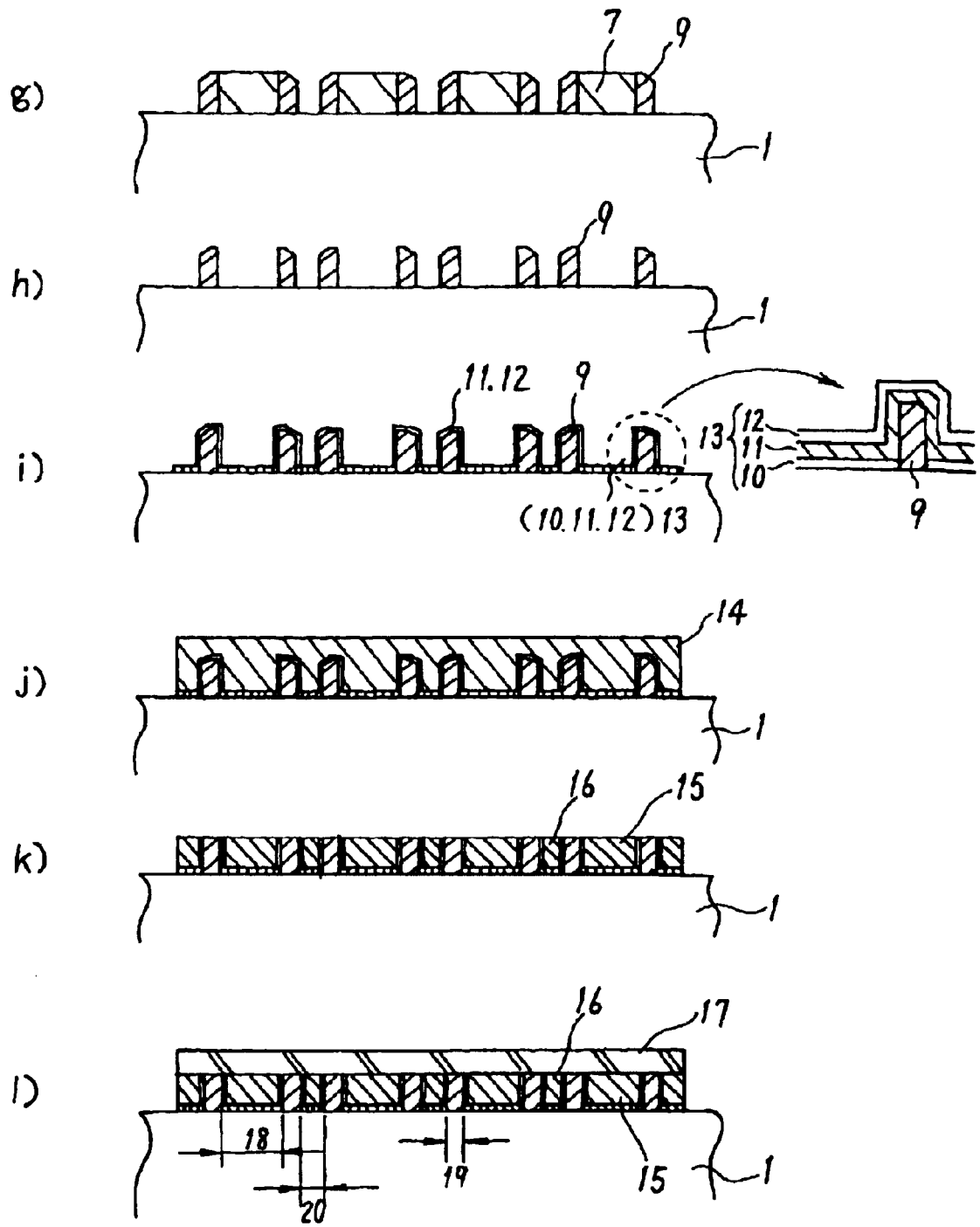
FIG. 4 is a sectional view of the manufacturing process in the first embodiment.
Figure 5:
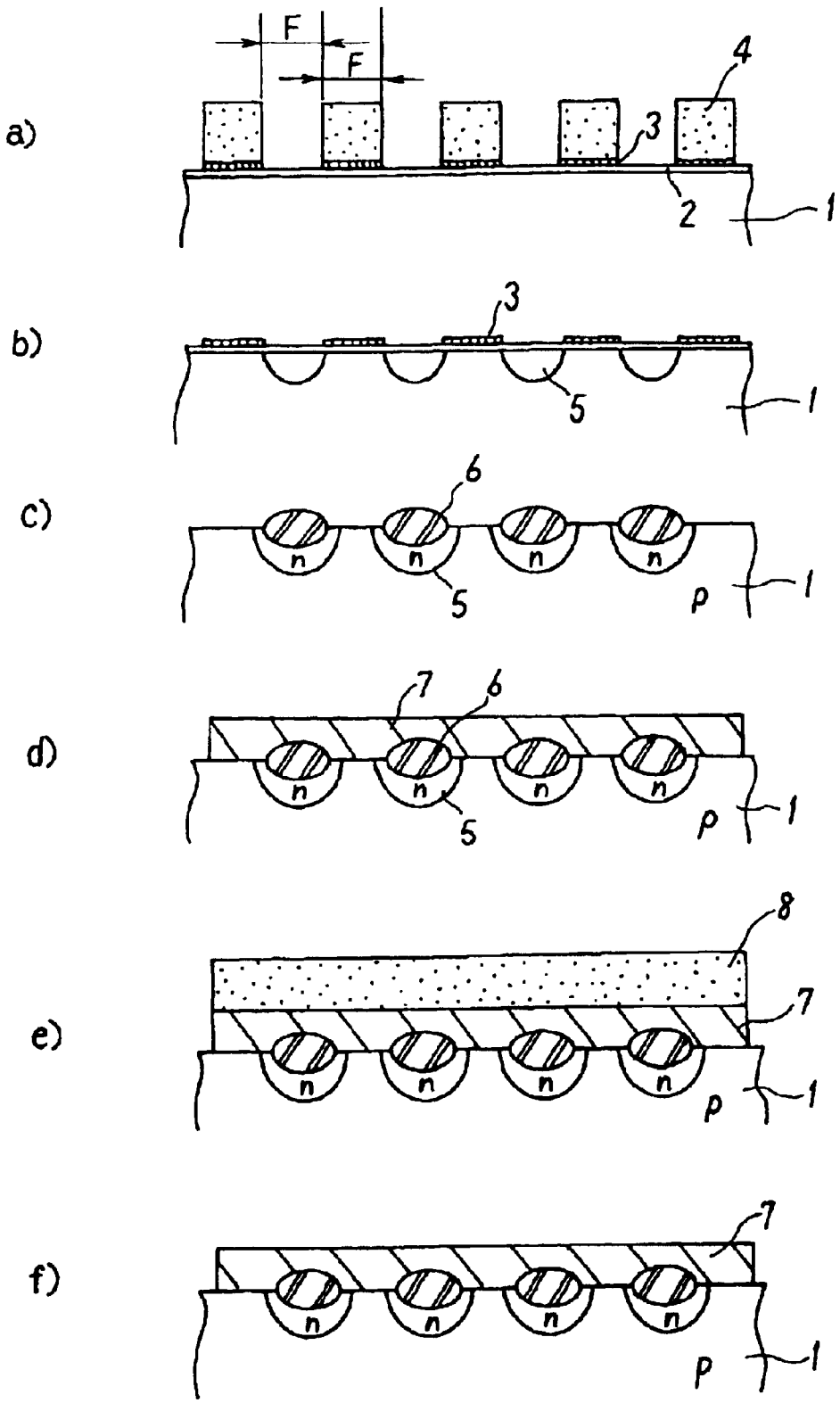
FIG. 5 is a sectional view of the manufacturing process in the first embodiment.
Figure 6:
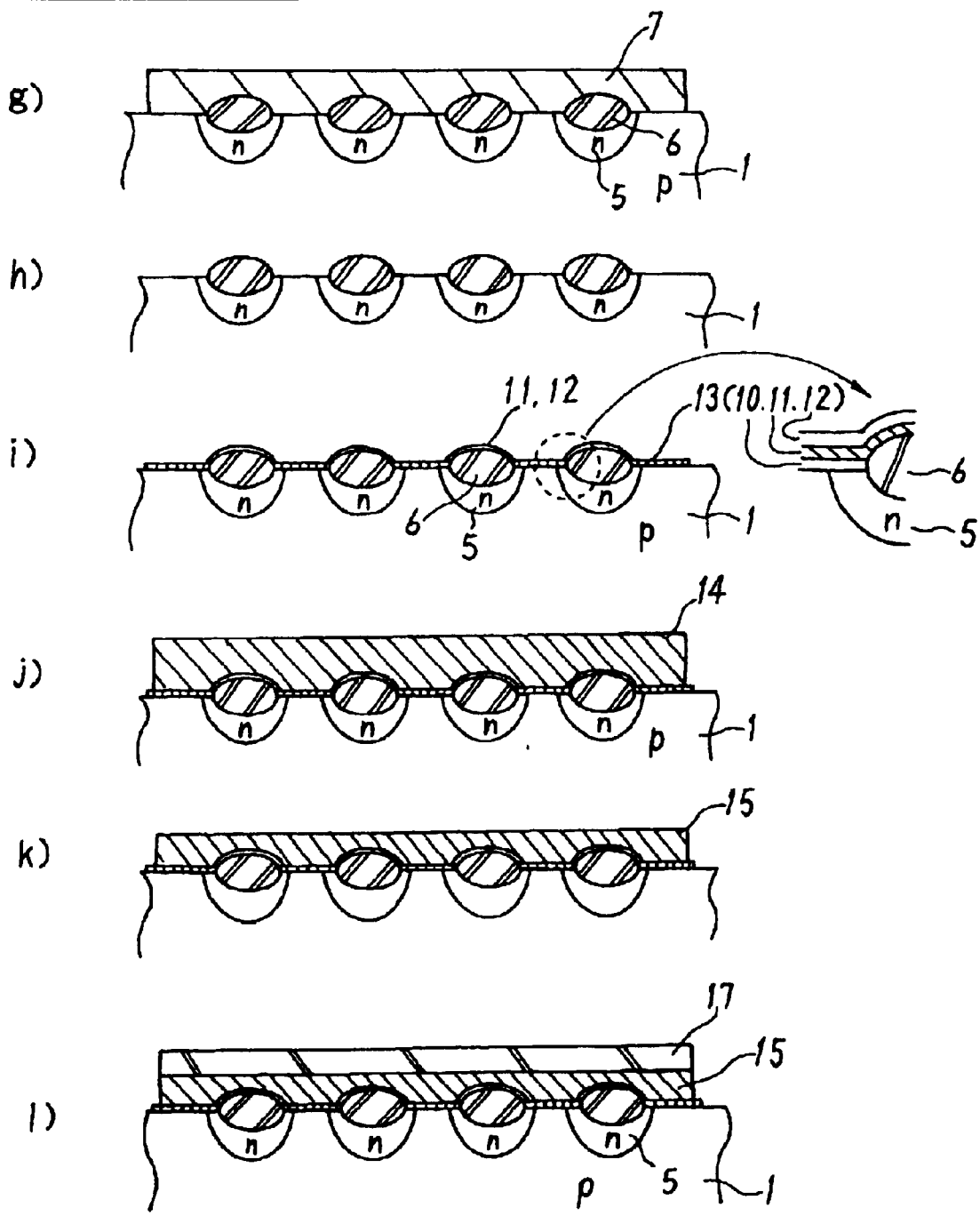
FIG. 6 is a sectional view of the manufacturing process in the first embodiment.
Figure 7:
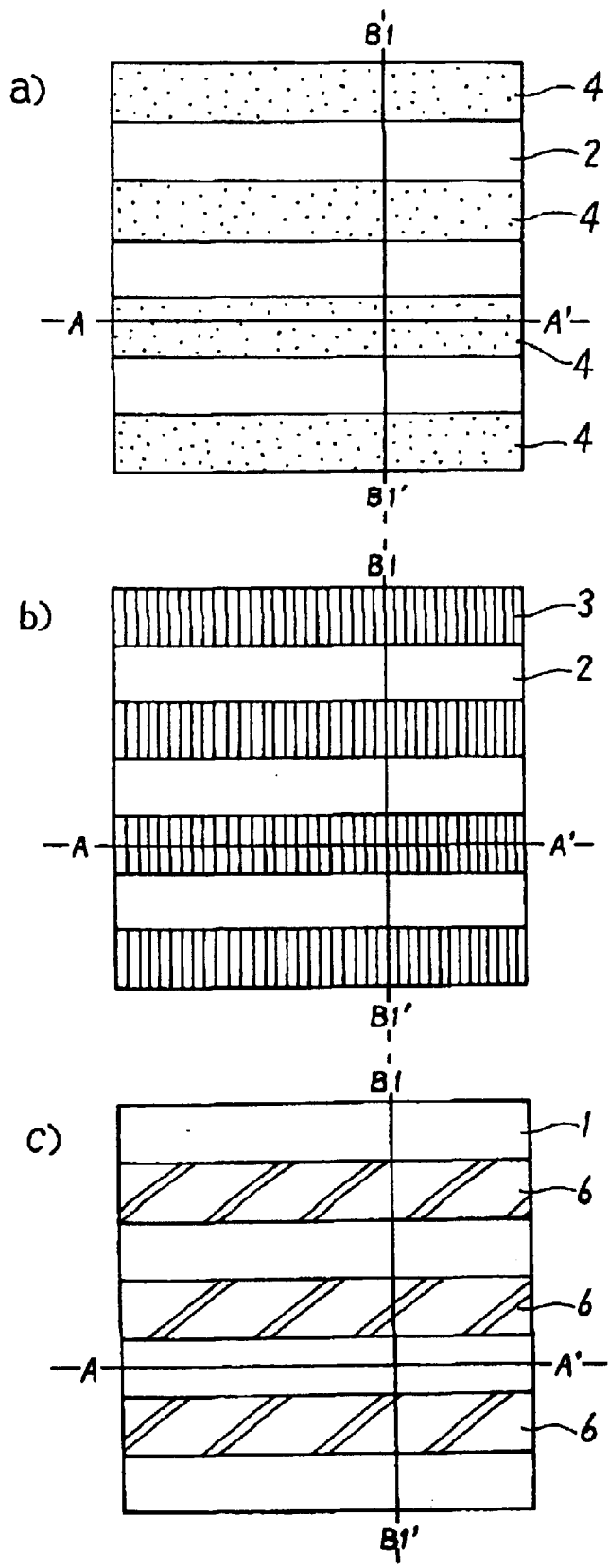
FIG. 7 is a plan view of the manufacturing process in the first embodiment.
Figure 8:
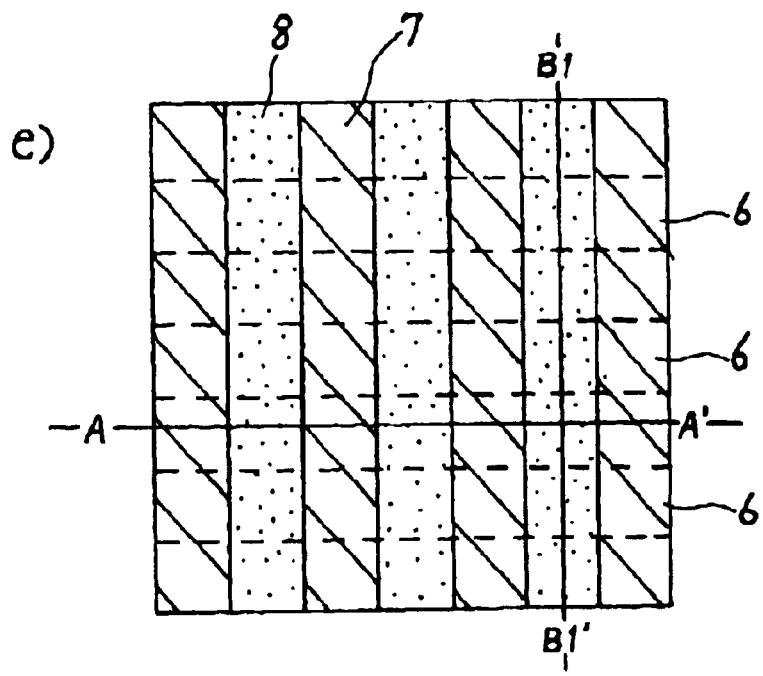
FIG. 8 is a plan view of the manufacturing process in the first embodiment.
Figure 8:
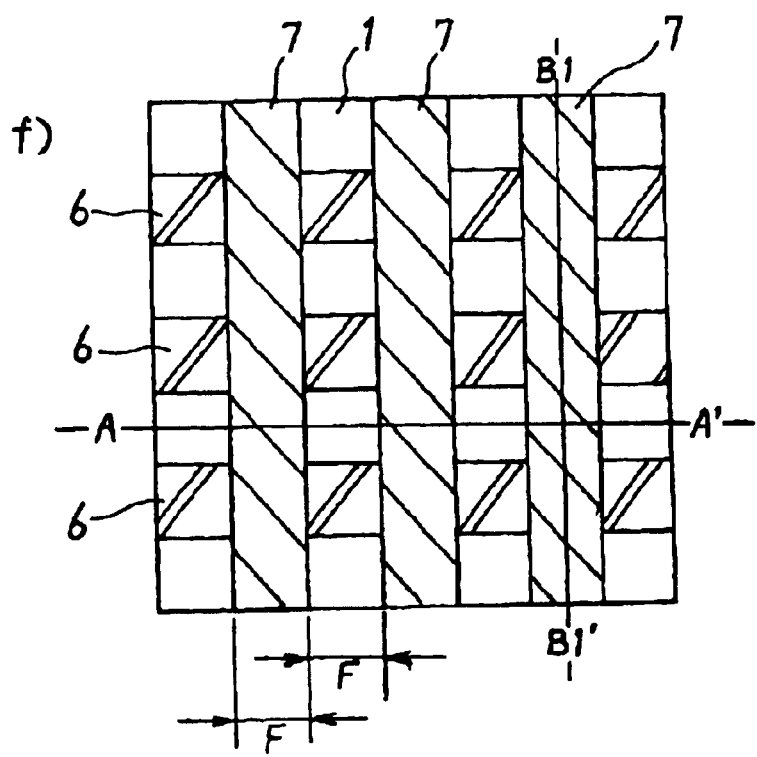
Figure 9:
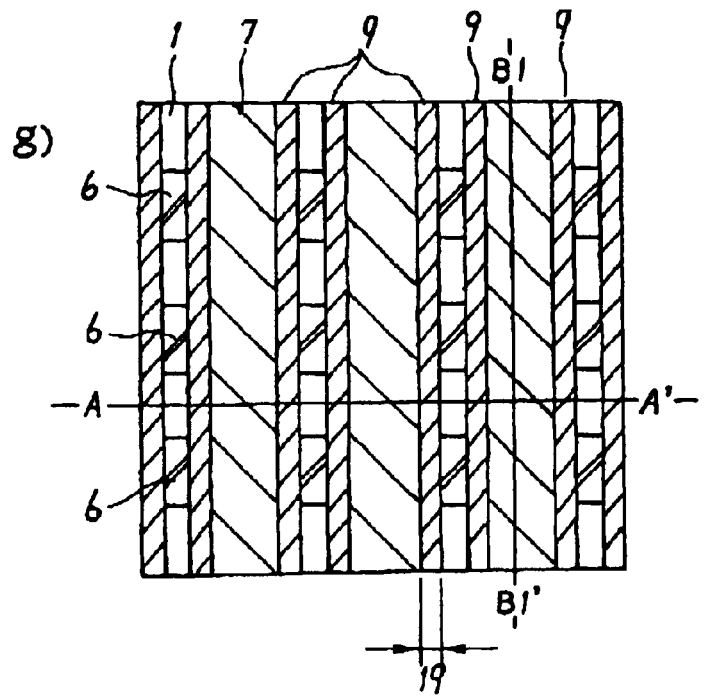
FIG. 9 is a plan view of the manufacturing process in the first embodiment.
Figure 9:
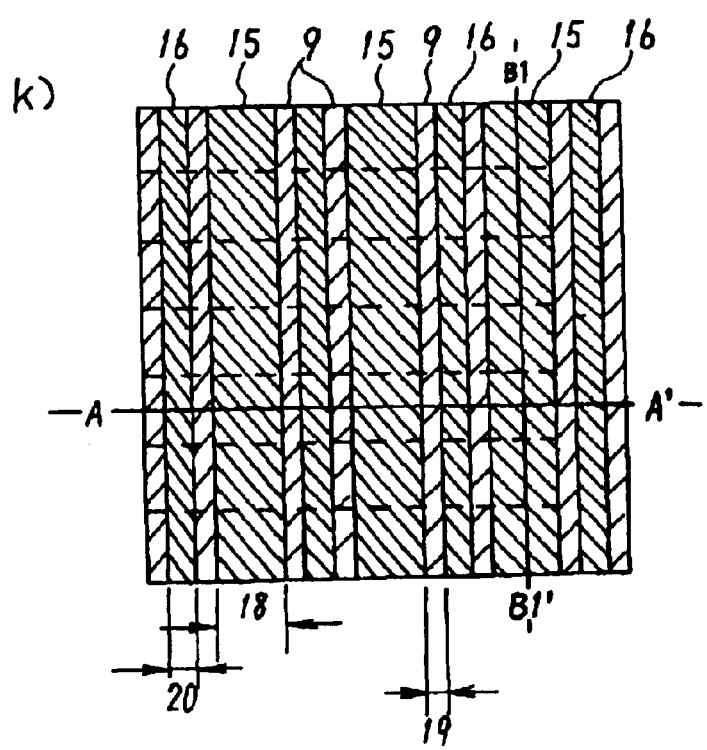
Figure 10:
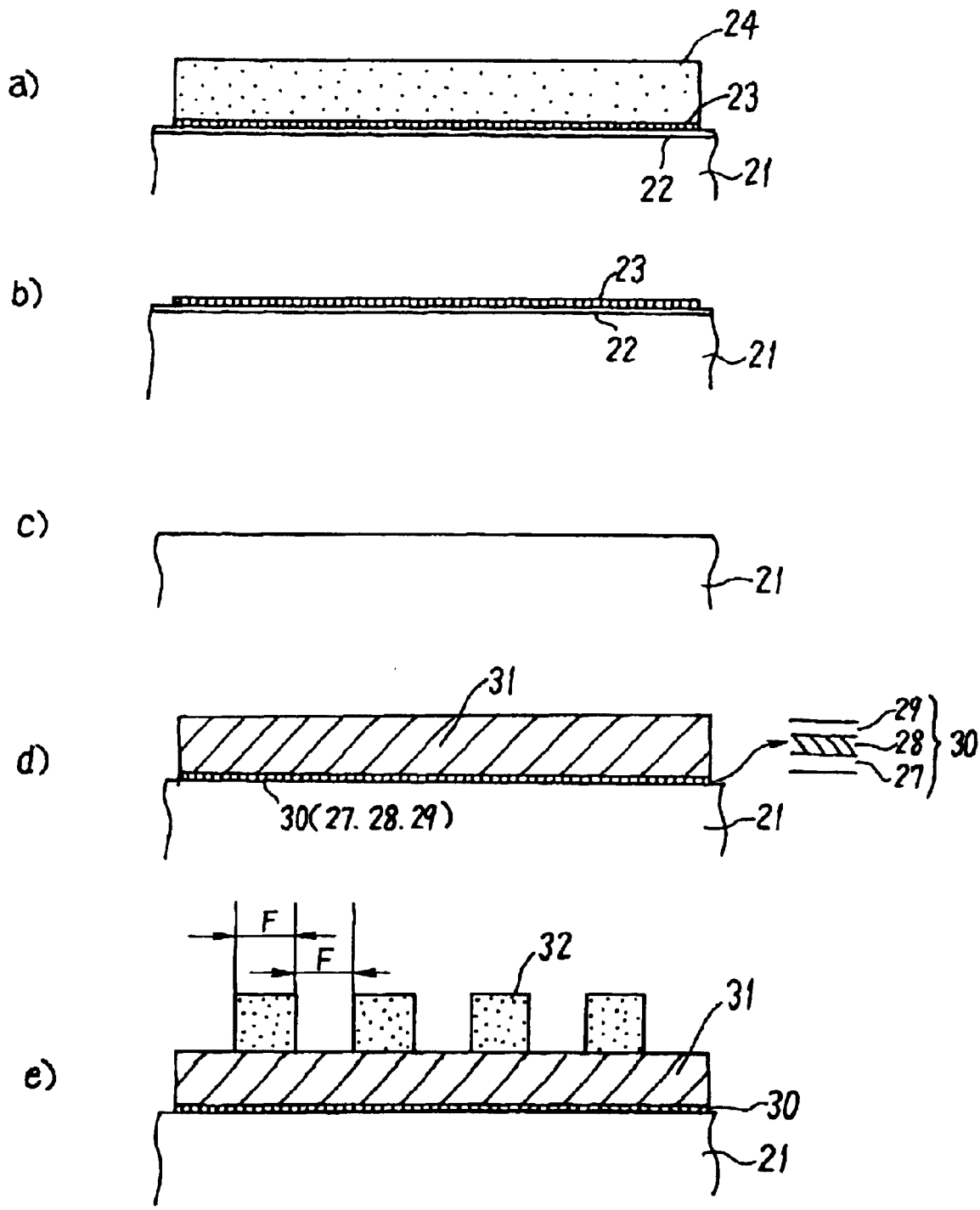
FIG. 10 is a sectional view of a manufacturing process in a second embodiment.

Next, a process for manufacturing a memory constructed of the cell transistor having the trap gate mentioned above will be described. FIGS. 3–9 depict a diagram of the manufacturing process in a first embodiment. FIGS. 3 and 4 show a sectional view of the respective steps, FIGS. 5 and 6 illustrate another sectional view of each step and FIGS. 7, 8 and 9 show a plan view of each step. The sectional view of A-A', the direction of the bit line extending in the plan view, is shown in FIGS. 3 and 4. The sectional view of B-B', the direction of the word line extending, is shown in FIGS. 5 and 6. Moreover, a, b and c shown in each Figure represent the same steps, respectively. Accordingly, referring to two sectional views and one plan view in each step, the manufacturing process will be described.

Reference is made to FIGS. 3a, 5a and 7a. A silicon oxide film 2 having a film thickness of about 100 nm is formed on a P-type semiconductor substrate 1 by a known thermal oxidation. Sequentially, a silicon nitride film 3 having a film thickness of about 150 nm is deposited by a known CVD (chemical vapor deposition) method.

Next, a resist pattern 4 is formed on the position corresponding to the defused layer region by a known photolithography method and then the exposed silicon nitride film 3 is selectively removed by a known etching method. At this time, the line width and interval of the resist pattern 4 are in the possible minimum fabrication dimensions (F).

Reference is made to FIGS. 3b, 5b and 7b. Then, an N-type defused layer 5 corresponding to the bit line is formed by implanting about 5E15–5E16 [ions/cm$^{-2}$] of an arsenic ion at 50–150 KeV, for example, into the P-type semiconductor substrate 1 by a known ion implanting method using the resist pattern 4 as a mask. After that, the resist pattern 4 is removed. In addition, 5E15 described above means $5 \times 10^{15}$, and so forth.

Reference is made to FIGS. 3c, 5c and 7c. Next, a field oxide layer 6 having a film thickness of about 200 nm is formed on the substrate 1 by the known thermal oxidation using the silicon nitride film 3 as a mask. Then, the silicon nitride film 3 is removed by a known wet etching method. At the same time, the surface of the P-type semiconductor substrate 1 in the region other than the field oxide layer 6 is exposed.

Also at this time, after the field oxide layer 6 is formed or the silicon nitride film 3 is removed, an impurity ion for adjusting a channel concentration may be implanted into the P-type semiconductor substrate 1 by the known ion implanting method. By this channel concentration adjustment, the threshold voltage of the cell transistor is adjusted. When it is desired to thicken the impurity concentration of the P-type semiconductor substrate 1, about 5E11–5E12 [ions/cm$^{-2}$] of a boric ion at 30–90 KeV, for example, may be implanted. Conversely, when it is desired to thin said impurity concentration, about 5E11–5E12 [ions/cm$^{-2}$] of a phosphorous ion at 60–100 KeV, for example, may be implanted.

Reference is made to FIGS. 3d and 5d. Next, a silicon nitride film 7 having a film thickness of about 700 nm is deposited on the exposed semiconductor substrate 1 by the known CVD method. Subsequently, the surface is planarized by polishing the silicon nitride film 7 by about 300 nm by a known CMP (chemical mechanical polishing) method.

Reference is made to FIGS. 3e, 5e and 8e. Then, a resist pattern 8 is formed on the position of a first word line electrode by the known photolithography method. The line width and interval of the resist pattern 8 are in the possible minimum fabrication dimensions (F).

Reference is made to FIGS. 3f, 5f and 8f. After the silicon nitride film 7 is selectively removed by the known etching method using the resist pattern 8 set forth as a mask, the resist pattern 8 is removed. Consequently, a plurality of the striped patterns 7 extending in the word line direction is formed as shown in FIG. 3f. Furthermore, the striped pattern 7 is fabricated by the minimum line width dimensions.

Reference is made to FIGS. 4g, 6g, 9g and 17g. Next, the silicon oxide film having a film thickness of about 100 nm is deposited throughout on the surface by the known CVD method and is etched back throughout the surface by the known etching method. Thereby, a side wall oxide film 9 having a 0.09 µm (90 nm) width (about 90% of film thickness) on one side, for example, is formed on both sides of the silicon nitride film 7. Forming the side wall oxide film can be conducted with excellent repeatability by the known forming method.

Figure 17:
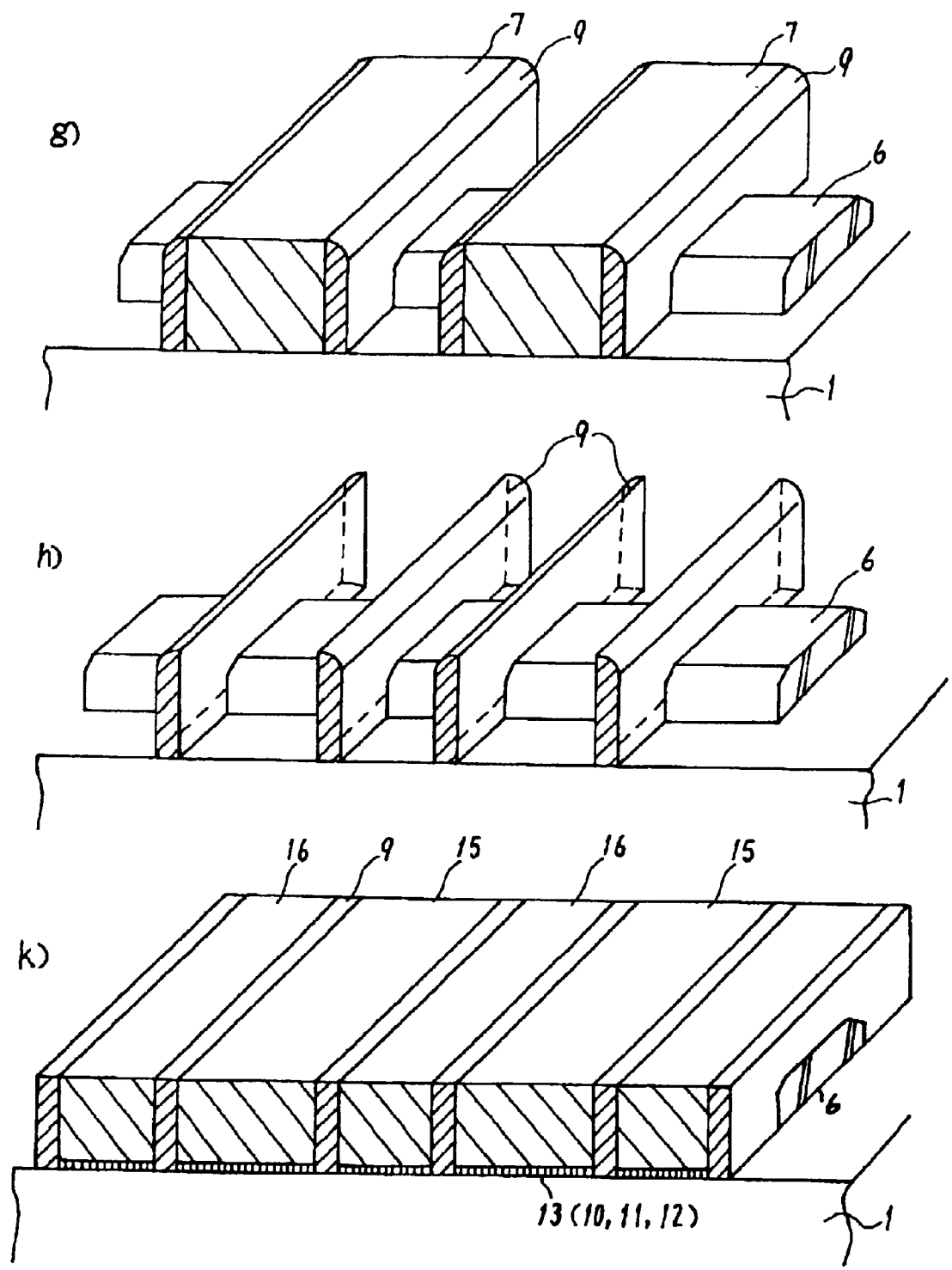
FIG. 17 is a perspective view of a part of manufacturing process in the first embodiment.

This condition will be understood well by referring to a perspective view shown in FIG. 17. As shown in FIG. 17g, the thin side wall oxide film 9 is formed on both sides of the striped pattern 7.

Reference is made to FIGS. 4h, 6h and 17h. Then, by the known wet etching method, only the silicon nitride film 7 is selectively removed with a phosphoric acid solution, for example. Consequently, a plurality of the sidewall insulating films 9 aligned at intervals of the minimum line width are formed. This condition is also illustrated by a perspective view in FIG. 17h.

Reference is made to FIGS. 4i and 6i. Subsequently, the silicon oxide film having a film thickness of about 15 nm is formed on the exposed semiconductor substrate 1 by the known thermal oxidation method. The silicon nitride film having a film thickness of about 10 nm is then deposited by the known CVD method. After this, by applying a heat treatment in the oxygen atmosphere at 900–950° C. for 30–60 minutes to oxidize the upper part of said silicon nitride film by about 6 nm according to the known thermal oxidation method, a gate insulating film 13 of the three-layer structure constructed of a silicon oxide film 10, a silicon nitride film 11 and a silicon oxide film 12 is formed. In this case, the silicon nitride film 11 is to be the insulating film for the carrier trap gate.

Furthermore, in the region of the side wall oxide film 9 other than the semiconductor substrate 1, only the silicon nitride film 11 and the silicon oxide film 12 are formed. In addition, the three-layer structure 13 is sequentially formed on the field insulating film 6. Accordingly, the structure is formed wherein the gate insulating film having the trap gate continues between the adjacent cell transistors in the word line direction.

Also at this time, instead of the step c, the impurity ion for adjusting a channel concentration may be implanted into the semiconductor substrate 1 by the known ion implanting method after the side wall oxide film 9 is deposited or the gate insulating film 13 is deposited. Similar to the step c, when it is desired to thicken the impurity concentration of the semiconductor substrate 1, about 5E11–5E12 [ions/cm$^{-2}$] of a boric ion at 30–90 KeV, for example, may be implanted. Conversely, when it is desired to thin said impurity concentration, about 5E11–5E12 [ions/cm$^{-2}$] of a phosphorous ion at 60–100 KeV, for example, may be implanted.

Reference is made to FIGS. 4j and 6j. Subsequently, a polycrystalline silicon film 14 containing about 2–6E20 [atoms/cm$^{-3}$] of a phosphor is deposited to have a film thickness of about 500 nm throughout on the surface. Therefore, the conductive polycrystalline silicon film 14 is formed between the side wall oxide films 9 and thereon.

Reference is made to FIGS. 4k, 6k, 9k and 17k. Next, word line electrodes 15 and 16 are formed between the side wall oxide films 9 by removing the upper layer part of the polycrystalline silicon film 14 other than the region between the side wall oxide films 9 and the gate insulating films 13 by the known CMP method or etch back method. These word line electrodes 15 and 16 are self-alignedly formed with respect to the striped pattern 7 that was formed first without using another mask alignment. In addition, the surface is planarized by said CMP treatment at the same time. This condition is depicted by a perspective view in FIG. 17k.

Thus, the respective first and second carrier trap films 11 and the respective first and second word lines 15 and 16 are formed at the same time so that the number of steps are fewer than a conventional example. Furthermore, the first and second word lines 15 and 16 are formed self-alignedly. Therefore, it is unlikely to vary the characteristics of respective memory cells having the first word line from those having the second word line due to the dispersion during the manufacturing process. In addition, the surface after the first and second word lines are formed is plane so that the planarization treatment prior to forming signal wiring is unnecessary.

Reference is made to FIGS. 4i, and 6i. After that, an interlayer insulating film 17 is deposited on the side wall 9 and the word lines 15 and 16. Since the surface is already made in the plane condition during the pre-process, the planarization treatment by the CMP method is unnecessary prior to forming this interlayer insulating film. Subsequently, opening a contact hole and forming metal wiring etc. not shown are conducted and the non-volatile semiconductor memory is manufactured.

In the manufacturing process set forth, the dimensions of the respective word lines 15 and 16 are exemplified as follows. A gate width 18 of the first word line electrode 15 is 0.4 µm (=F), for example. Suppose a total film thickness 19 of the insulating film constructed of the side wall oxide film 9, the silicon nitride film 11 and the silicon oxide film 12 is α; where the width of the side wall oxide film 9 is 0.09 µm, the film thickness of the silicon nitride film 11 and the silicon oxide film 12 is about 10 nm (=0.01 µm) as set forth. In this case, α=0.09 µm+0.01 µm=approximately 0.10 µm; a gate width 20 of the second word line electrode 16 is F−2α=0.2 µm.

According to the embodiment described above, the word line electrodes 15 and 16 are self-alignedly formed at the same time through the insulating film constructed of the side wall oxide film 9, the silicon nitride film 11 and the silicon oxide film 12 and an SONOS (Silicon Oxide Nitride Oxide Silicon) type non-volatile memory cell can be obtained as well. In this memory cell, data is stored whereby the silicon nitride film 11 becomes the trap gate and is injected with carriers.

Furthermore, in the embodiment mentioned above, other films may be used for the silicon oxide film 7 and the side wall nitride films 9 as long as the combination of the substituted insulating films is capable of selectively removing one of the films with no mask. For example, the materials may be conversed: a silicon oxide film 7 and a side wall nitride films 9, and only the silicon oxide film 7 may be selectively removed with a hydrofluoric acid solution in FIGS. 4h and 6h. In addition, if a sufficient etching selective ratio will be provided, the dry etching may be used instead of the wet etching. Where the side wall film 9 is preferably the insulating film for isolating the word line electrodes.

In addition, the first and second word lines 15 and 16 are formed of the polycrystalline silicon film in the embodiment described above. However, a silicide film or metal film including such as W (tungsten), Mo (molybdenum) and Ti (titanium) or a conductive film of a composition combined therewith may be used.

Figure 14:
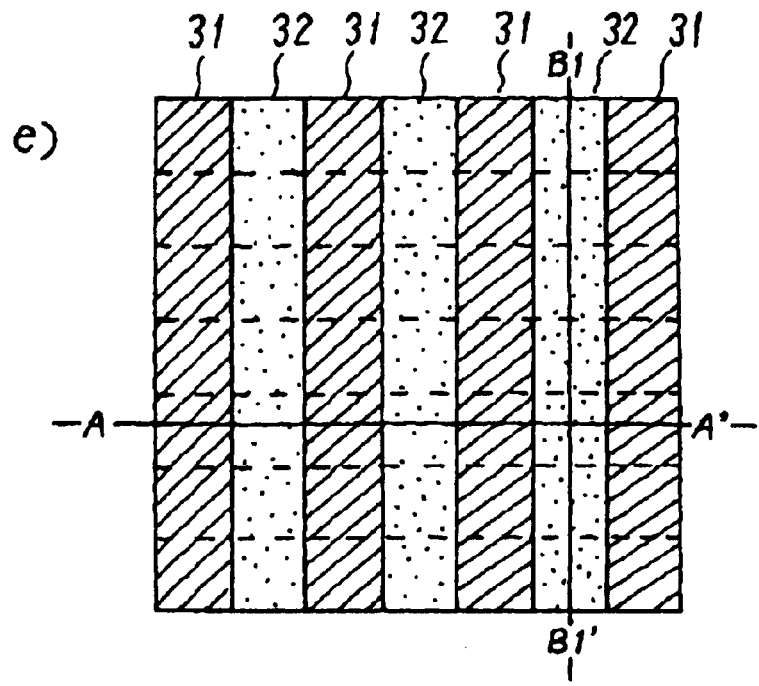
FIG. 14 is a top plan view of the manufacturing process in the second embodiment.
Figure 14:
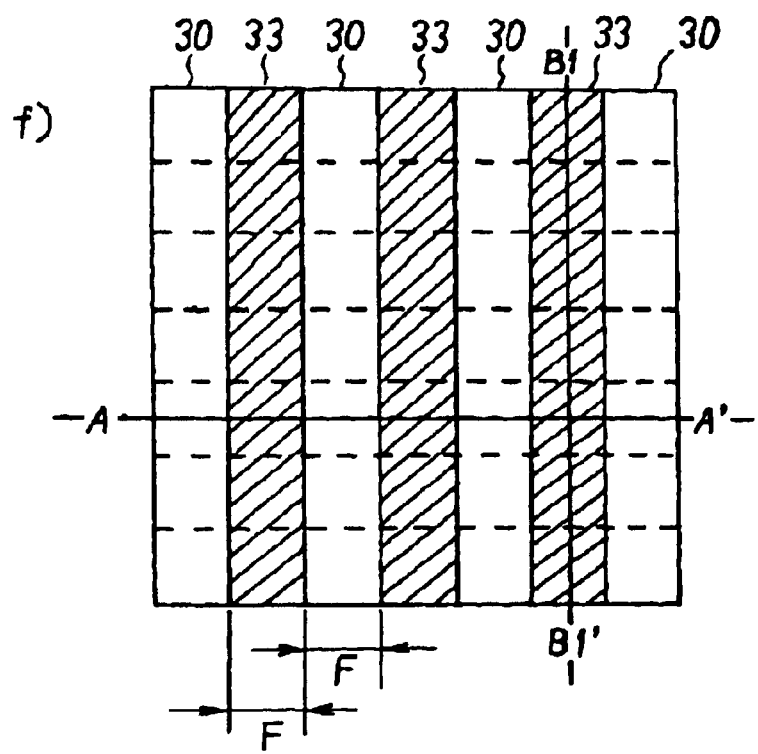
Figure 15:
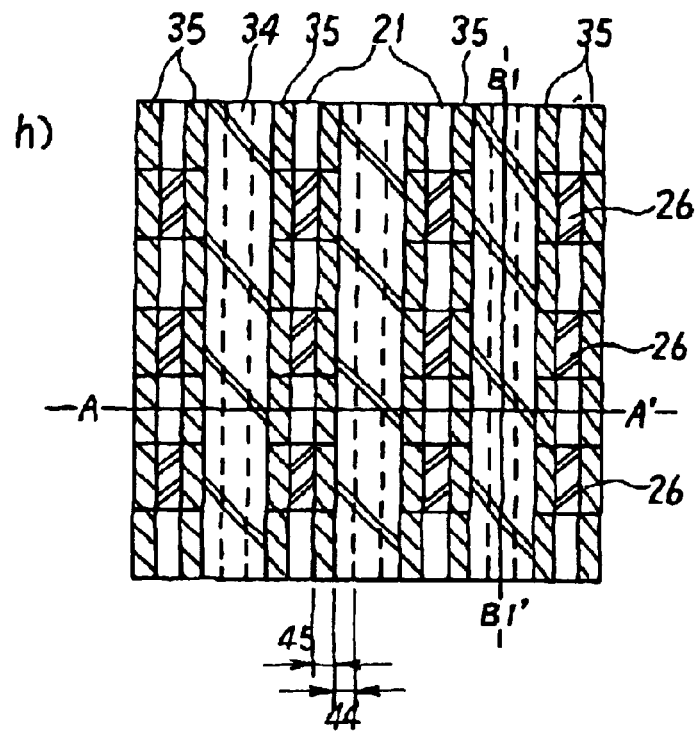
FIG. 15 is a top plan view of the manufacturing process in the second embodiment.
Figure 15:
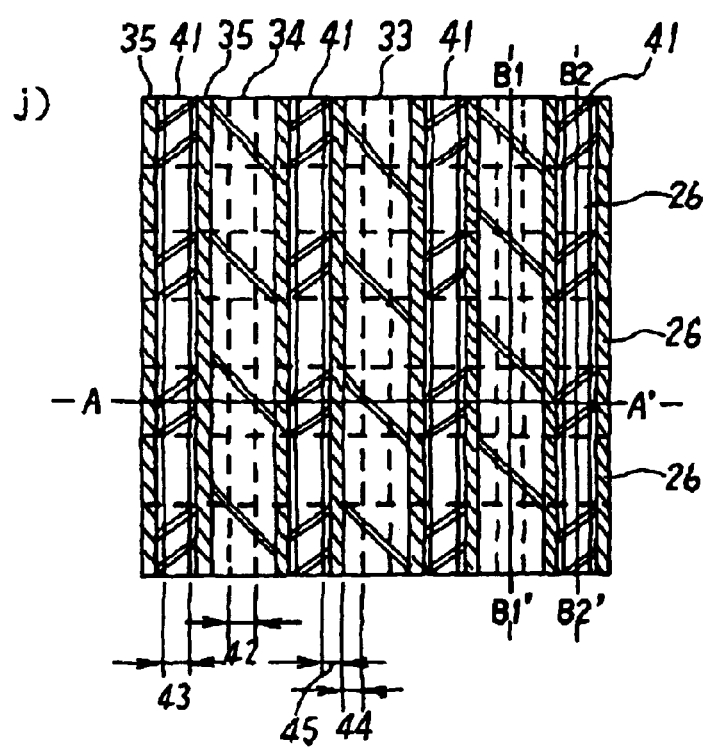

A second embodiment of the present invention will now be described. FIGS. 10, 11, 12 and 13 illustrate a sectional view of a manufacturing process in the second embodiment and FIGS. 14 and 15 depict a plan view thereof. The plan views show only a part of the process. The second embodiment can also form the first and second word line electrodes by the self alignment with the structure of the non-volatile memory cell having the trap gate exploited.

Reference is made to FIGS. 10a and 12a (FIG. 7a for the plan view). A silicon oxide film 22 having a film thickness of about 100 nm is formed on a P-type semiconductor substrate 21 by the known thermal oxidation. A silicon nitride film 23 having a film thickness of about 150 nm is sequentially deposited by the known CVD method. Next, a resist pattern 24 is formed on the position corresponding to the defused layer region by the known lithography method and then the exposed silicon nitride film 23 is selectively removed by the known etching method. At this time, the line width and interval of the resist pattern 24 are in the possible minimum fabrication dimensions (F). Here, F=0.4 $\mu$m, for example.

Reference is made to FIGS. 10b and 12b (FIG. 7b for the plan view). Subsequently, an N-type defused layers 25 corresponding to the bit line are formed by implanting about 5E15–5E16 [ions/cm$^{-2}$] of an arsenic ion at 50–150 KeV, for example, into the P-type semiconductor substrate 21 by the known ion implanting method using the resist pattern 24 as a mask. The resist pattern 24 is then removed.

Reference is made to FIGS. 10c and 12c (FIG. 7c for the plan view). Next, a field oxide film 26 having a film thickness of about 200 nm is deposited by the known thermal oxidation method using the silicon nitride film 23 as a mask. Then the silicon nitride film 23 is removed by the known wet etching method. At the same time, the surface of the P-type semiconductor substrate 21 in the region other than the filed oxide film 26 is exposed.

Also at this time, impurity ions for adjusting a channel impurity concentration may be implanted into the semiconductor substrate 21 by the known ion implanting method after the filed oxide film 26 is deposited or the silicon nitride film 23 is removed. When it is desired to thicken the impurity concentration of the semiconductor substrate 21, about 5E11–5E12 [ions/cm$^{-2}$] of a boric ion at 30–90 KeV, for example, may be implanted. Conversely, when it is desired to thin said impurity concentration, about 5E11–5E12 [ions/cm$^{-2}$] of a phosphorous ion at 60–100 KeV, for example, may be implanted.

Reference is made to FIGS. 10d and 12d. Subsequently, a silicon oxide film having a film thickness of about 15 nm is deposited on the exposed semiconductor substrate 21 by the known thermal oxidation method. A silicon nitride film having a film thickness of about 10 nm is then deposited by the known CVD method. Then, the upper part of the said silicon nitride film is oxidized by about 6 nm by applying the heat treatment in the oxygen atmosphere at 900–950° C. for about 30–60 minutes according to the known thermal oxidation method. Therefore, a first gate insulating film 30 of the three-layer structure constructed of a silicon oxide film 27, a silicon nitride film 28 and a silicon oxide film 29. In this case, the silicon nitride film 28 becomes a first carrier trap gate film.

Next, a polycrystalline silicon film 31 containing about 2–6E20 [atms/cm$^{-3}$] of a phosphor is deposited to have a film thickness of about 800 nm by the known CVD method. Then, the surface is planarized by polishing the polycrystalline silicon film 31 by about 300 nm by the known CMP method.

Reference is made to FIGS. 10e, 12e and 14e. Then, a resist pattern 32 is formed on the position of a first word line electrode on the polycrystalline silicon film 31 by the known lithography method. At this time, the line width and interval of the resist pattern 32 are in the possible minimum fabrication dimensions (F). Here, F=0.4 $\mu$m, for example.

Reference is made to FIGS. 11f, 13f and 14f. Next, after the polycrystalline silicon film 31 is selectively removed by the known etching method using the resist pattern 32 as a mask so that a first word line electrode 33 is formed. Then, the resist pattern 32 is removed. The first word line electrode 33 is formed in the possible minimum fabrication dimensions.

Reference is made to FIG. 11g. Next, an oxide film converted layer 34 is formed by oxidizing the upper part and side wall of the first word line electrode 33 by about 100 nm (0.1 $\mu$m), for example, by the known thermal oxidation.

Reference is made to FIGS. 11h and 15h. Then, a silicon oxide layer having a film thickness of about 100 nm is deposited throughout on the surface by the known CVD method. A side wall oxide film 35 having a 0.09 $\mu$m width on one side, for example, is formed on both sides of the oxide film converted layer 34 by etching back the silicon oxide layer by the known etching method. At the same time, the surface of the semiconductor substrate 21 is exposed in the region other than the first word line electrode 33, the oxide film converted layer 34, the side wall oxide film 35 and the field oxide film 26 by the etch back process.

Reference is made to FIGS. 11i and 13i. Subsequently, a silicon oxide film having a film thickness of about 15 nm is deposited on the exposed semiconductor substrate 21 by the known thermal oxidation method. A silicon nitride film having a film thickness of about 10 nm is then deposited by the known CVD method. The upper part of said silicon nitride film is further oxidized by about 6 nm by applying the heat treatment in the oxygen atmosphere at 900–950° C. for about 30–60 minutes according to the known thermal oxidation method. Thereby, a second gate insulating film 39 of the three-layer structure constructed of a silicon oxide film 36, a silicon nitride film 37 and a silicon oxide film 38 is formed. In this case, the silicon nitride film 37 is a second carrier trap gate film. At this time, the silicon nitride film 37 and the silicon oxide film 38 are formed on the region other than the semiconductor substrate 21.

In addition, the impurity ions for adjusting a channel impurity concentration may be implanted into the semiconductor substrate 21 by the known ion implanting method, instead of a step c, after the side wall oxide films 35 is deposited or the second gate insulating film 39 is deposited. The conditions of the ion implantation are the same as those of the step c.

Reference is made to FIGS. 11j, 13j, 13j' (B2-B2' section) and 15j. Subsequently, a polycrystalline silicon film 41 containing about 2–6E20 [atms/cm$^{-3}$] of a phosphor is deposited to have a film thickness of about 500 nm by the known CVD method. Then, said polycrystalline silicon film 41 other than the groove surrounded by the side wall oxide film 35 and the second gate insulating film 39 is removed by the known CMP method or etch back method. Consequently, the second word line electrode 41 is self-alignedly formed between the first word line electrodes 33.

At this time, the oxide film converted layer 34 on the first word line electrodes 33 functions as a polishing stop layer in the CMP or etching stop, facilitates the end point detection and prevents the first word line from being etched in processing the polycrystalline silicon film 41. Furthermore, as the result of forming the first and second word lines, the planarization treatment prior to metal wiring is unnecessary because of the flat surface. After this process, opening a contact hole, forming metal wiring and forming metal wiring etc. not shown are conducted and the non-volatile semiconductor memory is manufactured.

The dimensions of the respective word lines are exemplified as follows. Suppose the width of the first word line electrode is 0.4 $\mu$m (=F) and the film thickness 44 of the oxide film converted layer 34 is 100 nm (0.1 $\mu$m), for example. Consequently, the gate width 42 of the first word line electrode is 0.2 $\mu$m. In addition, suppose a total film thickness 45 of the insulating film constructed of the side wall oxide films 35, the silicon nitride film 37 and the silicon oxide film 38 is $\alpha$; where the width of the side wall oxide film 35 is 0.09 $\mu$m, the film thickness of the silicon nitride film 37 and the silicon oxide film 38 is about 10 nm (=0.01 $\mu$m). In this case, $\alpha$=0.09 $\mu$m+0.01 $\mu$m=approximately 0.10 $\mu$m. A gate width 43 of the second word line electrode 41 is F-2$\alpha$=0.2 $\mu$m.

As described above, in the second embodiment, by adjusting the film thickness of the oxide film converted layer 34 and $\alpha$ mentioned above, the line width of the first and second word lines 33 and 41 can be set the same without changing the memory size. Additionally, the operation of the non-volatile semiconductor memory configured in this manner is the same as the one described first.

According to the second embodiment as set forth, the first and second word line electrodes 33 and 41 are self-alignedly and high-densely formed with the same line width through the side wall oxide films 35, the silicon nitride film 37, the silicon oxide film 38 and further the oxide film converted layer 34. Furthermore, the SONOS type non-volatile memory cell of excellent flatness can be obtained.

Additionally, in the embodiments of the present invention, the respective word line widths are set equal but they can be independently controlled and formed: the width of the first word line electrode 33 by the film thickness of the oxide film converted layer 34 and the width of the second word line electrode 41 by the side wall oxide film 35. Therefore, it is easily possible to form the first and second word lines of equal line width or of different line width as well.

Further, since the oxide film converted layer 34 as the insulating film resides between the first and second word line electrodes as well as the sidewall oxide film 35, this structure hardly generates failure due to a short-circuit or leak between the electrodes compared with the conventional one.

Figure 16:
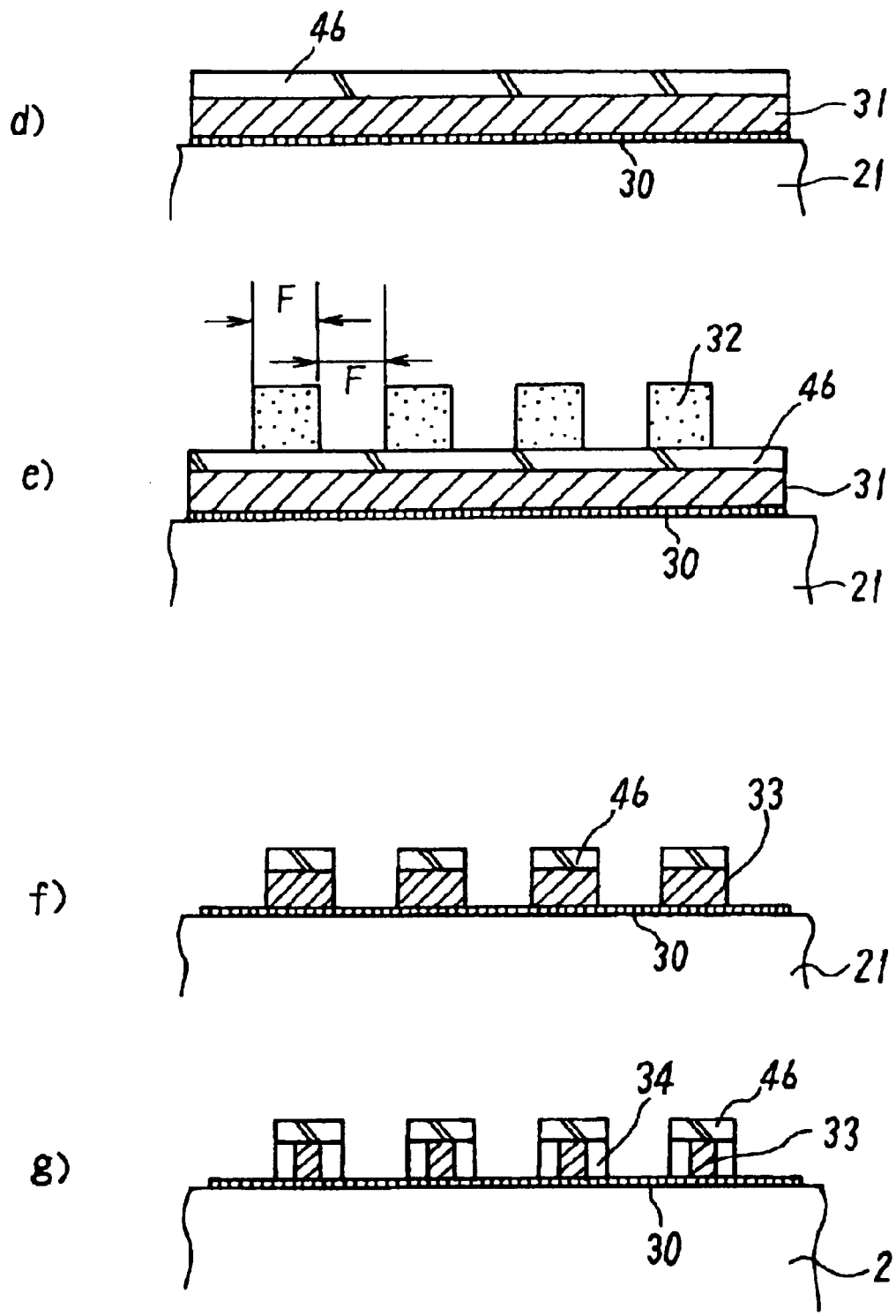
FIG. 16 is a process sectional view of a modified example in the second embodiment.

FIG. 16 is a sectional view showing a process of a modified example of the second embodiment. Steps d–g shown in FIG. 16 are sectional views instead of steps d–g shown in FIGS. 10 and 11. Although the oxide film converted layer 34 is formed on the side walls and upper part by oxidizing the first word line electrode 33 in the second embodiment, the insulating film covering the upper part of the first word line electrode 33 may be the insulating film such as the silicon oxide film or silicon nitride film deposited by the CVD method.

In this modified example, up to steps a–c are the same steps as described above. That is, the field oxide film 26 having a film thickness of about 200 nm is formed by the known thermal oxidation method using the silicon nitride film 23 as a mask. Then, the silicon nitride film 23 is removed by the known wet etching method. At the same time, the surface of the P-type semiconductor substrate 21 in the region other than the field oxide film 26 is exposed. Subsequently, the first gate insulating film 30 is formed on the exposed semiconductor substrate 21.

As shown in FIG. 16d, the polycrystalline silicon film 31 containing about 2–6E20 [atms/cm$^{-3}$] of a phosphor is deposited to have a film thickness of about 700 nm by the known CVD method. Then, the surface is planarized by polishing the upper part of the polycrystalline silicon film 31 by about 300 nm by the known CMP method. A silicon oxide film 46 having a film thickness of about 100 nm is deposited on the polycrystalline silicon film 31 by the known CVD method.

As shown in FIG. 16e, the resist pattern 32 is formed on the position of the first word line electrode on the silicon oxide film 46 by the known lithography method. The line width and interval of the resist pattern 32 are set in the minimum line width F.

As shown in FIG. 16f, the exposed silicon oxide film 46 and then the polycrystalline silicon film 31 are selectively removed by the known etching method using the resist pattern 32 as a mask. Alternatively, after removing the exposed silicon oxide film 46 by the known etching method using the resist pattern 32 as a mask, then the polycrystalline silicon film 31 may be selectively removed using the remaining silicon oxide film 46 as a mask.

As shown in FIG. 16g, the oxide film converted layers 34 are then formed by oxidizing the exposed side walls of the first word line electrode 33 by 100 nm (0.1 $\mu$m), for example, by the known thermal oxidation. Consequently, the line width of the first word line electrode 33 is narrower than the minimum line width F. Steps after this are the same as the second embodiment set forth.

As described above, by separately forming the insulating film (silicon oxide film 46) and the oxide film converted layer 34 on the first word line 33, the silicon oxide film 46 is given a function as a polishing stop layer in the CMP method or etching stop layer in the etch back. Additionally, the oxide film converted layer 34 is given a function of insulation to the second word line 41 and of controlling the line width of the first word line 33. Therefore, it is possible to set the silicon oxide film 46 and the oxide film converted layer 34 to have a different film thickness according to their roles.

For example, it is possible to increase the margin when processing the second word line by thickening only the silicon oxide film 46 by 200 nm (0.2 μm).

Figure 18:
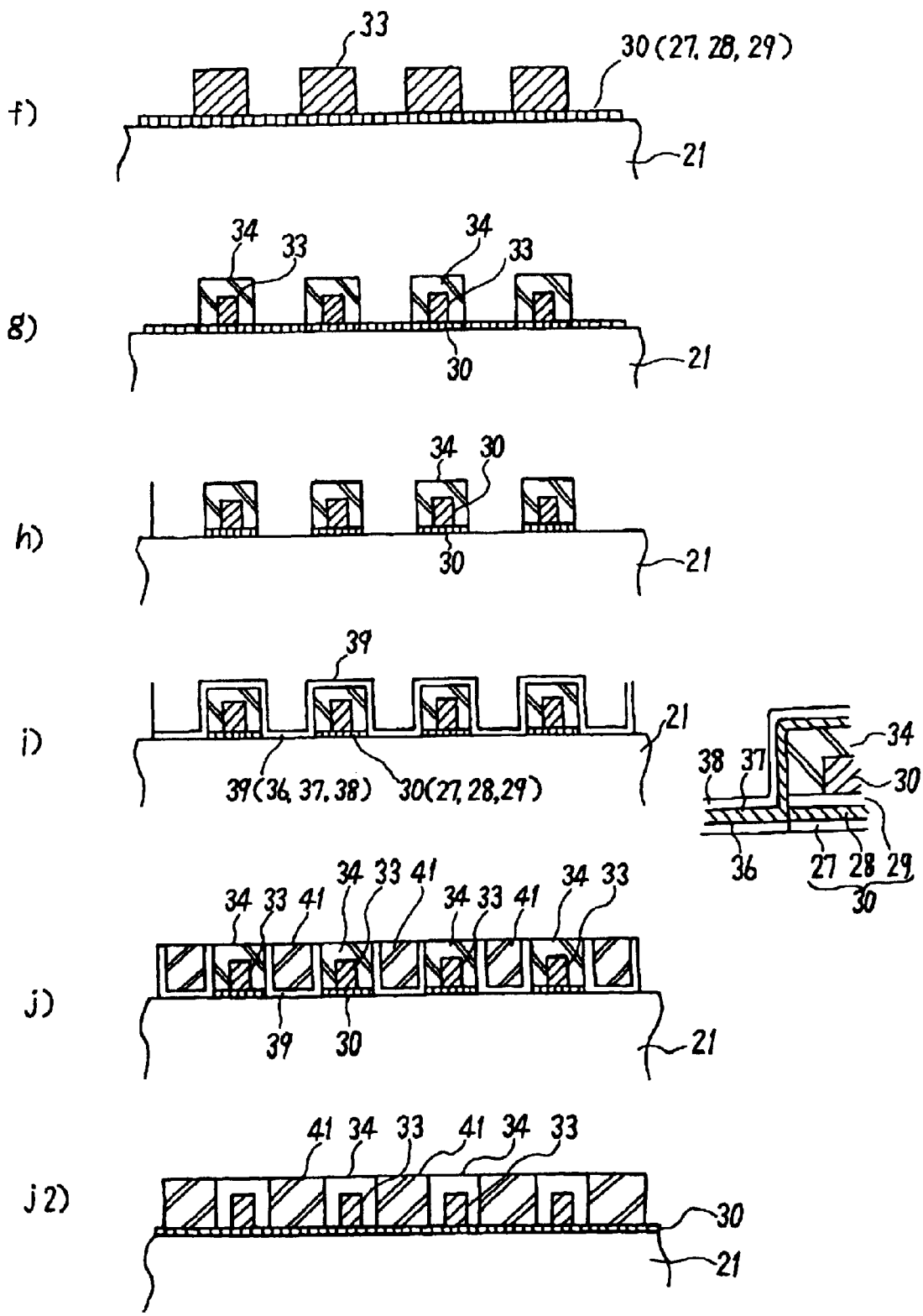
FIG. 18 is a process sectional view of another modified example in the second embodiment.

FIG. 18 is a process sectional view of another modified example in the second embodiment. In this modified example, steps h, i and j shown in FIG. 18 are adopted instead of the steps h, i and j shown in FIG. 11. Thus, steps a–g are the same as the steps a–g shown in FIGS. 10 and 11 in this modified example. In the modified example shown in FIG. 18, the side wall insulating film 35 utilized for controlling the width of the second word line 41 is not provided.

Figure 11:
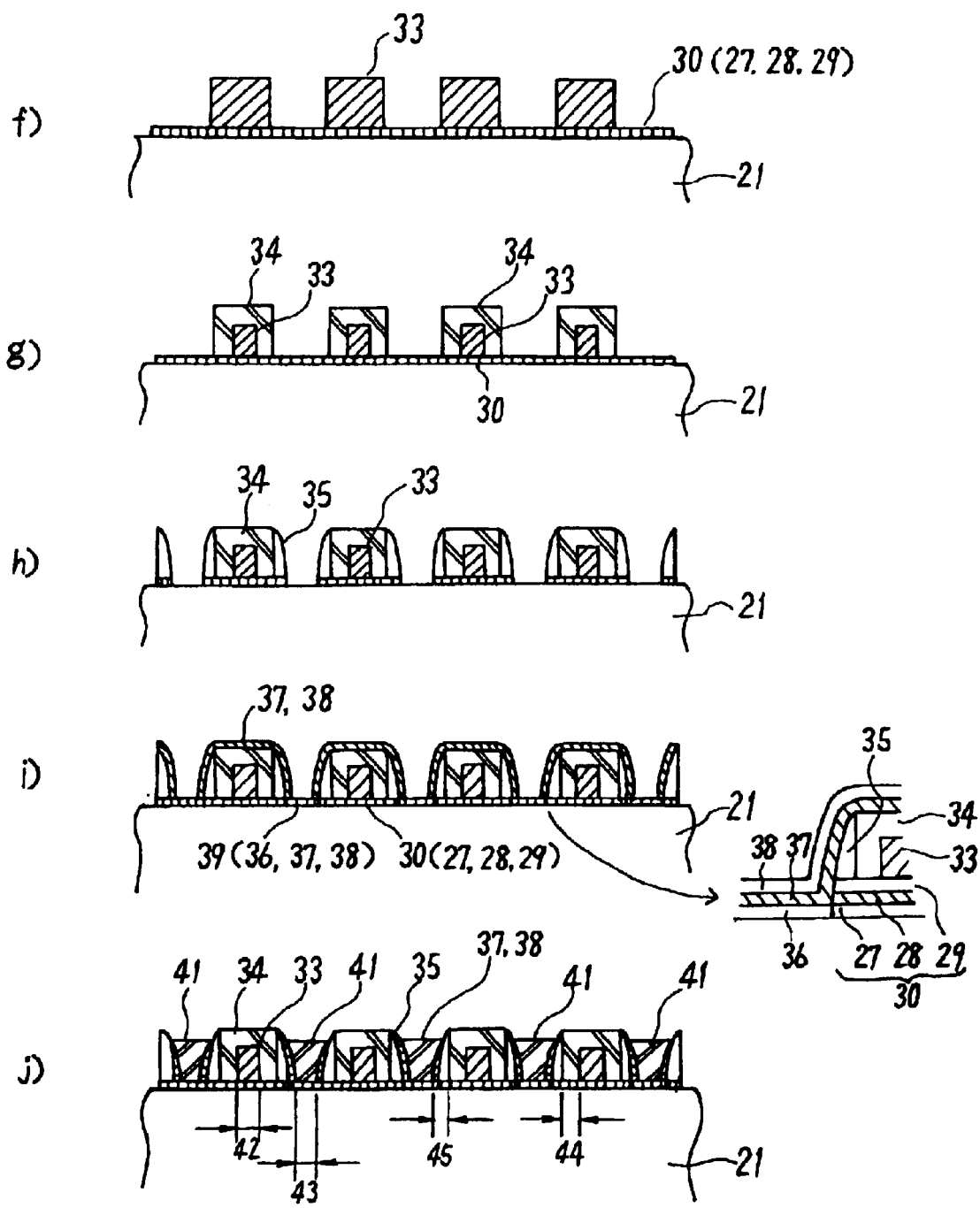
FIG. 11 is a sectional view of the manufacturing process in the second embodiment.
Figure 12:
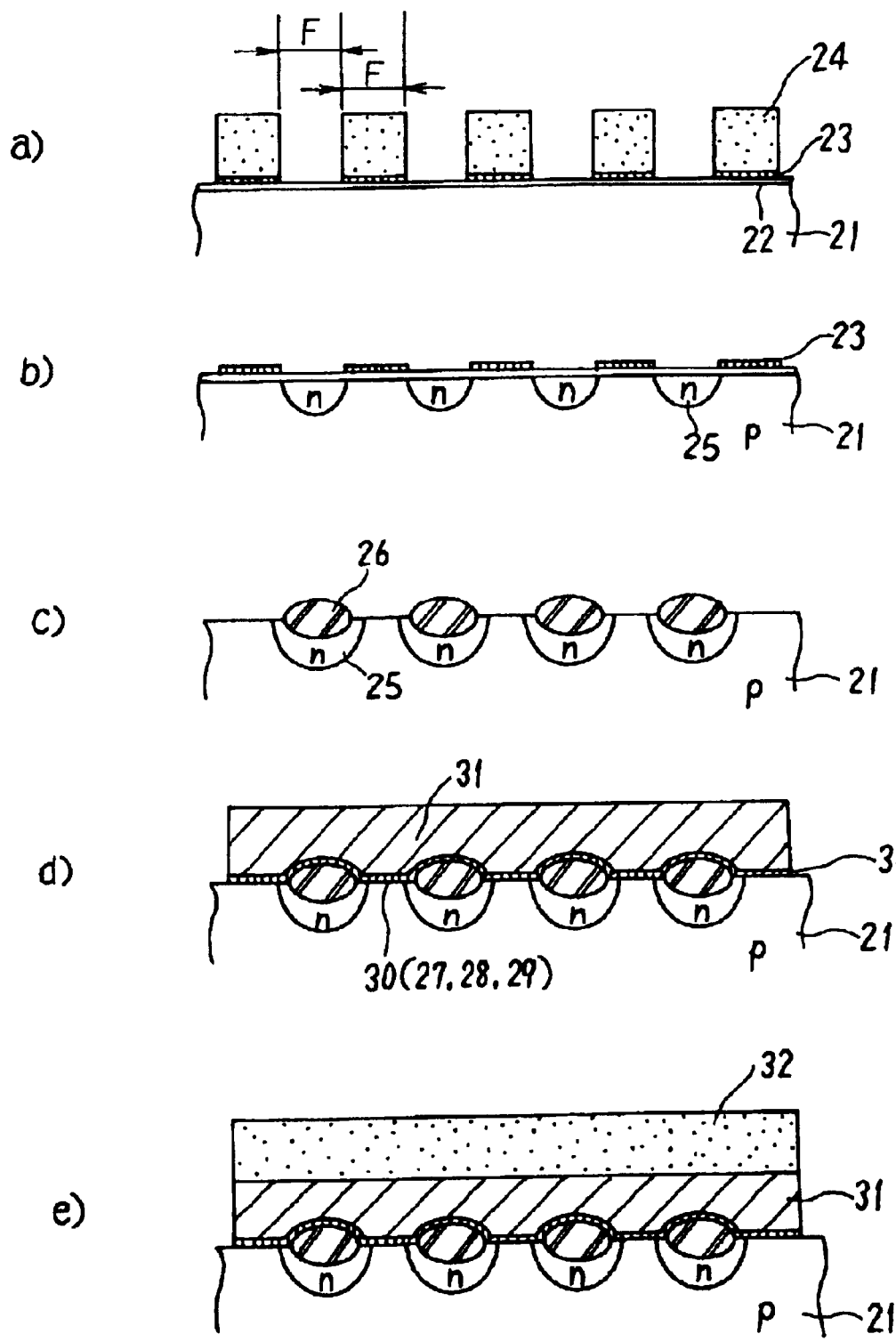
FIG. 12 is a sectional view of the manufacturing process in the second embodiment.
Figure 13:
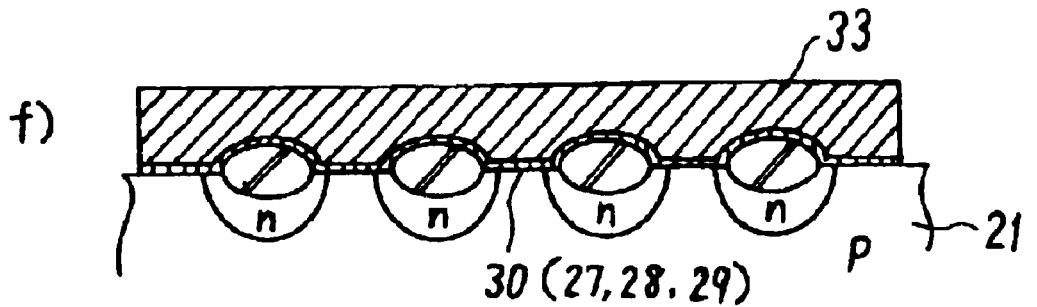
FIG. 13 is a sectional view of the manufacturing process in the second embodiment.
Figure 13:
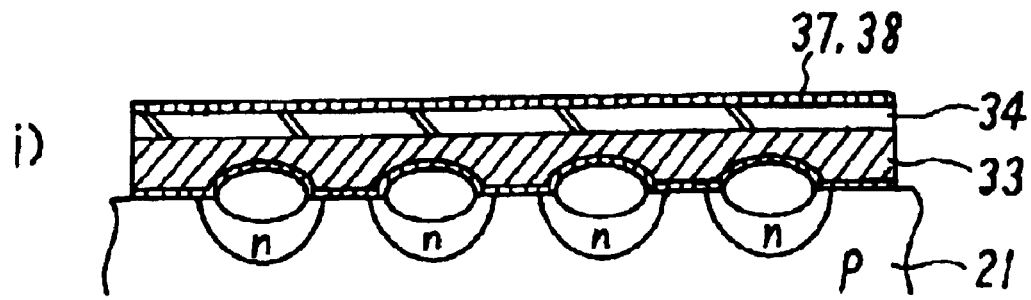
Figure 13:
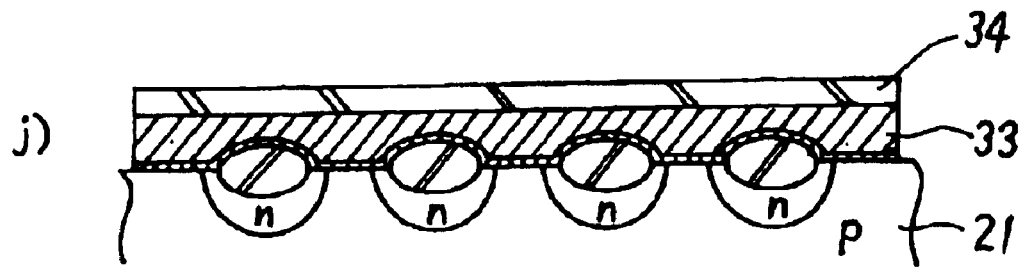
Figure 13:
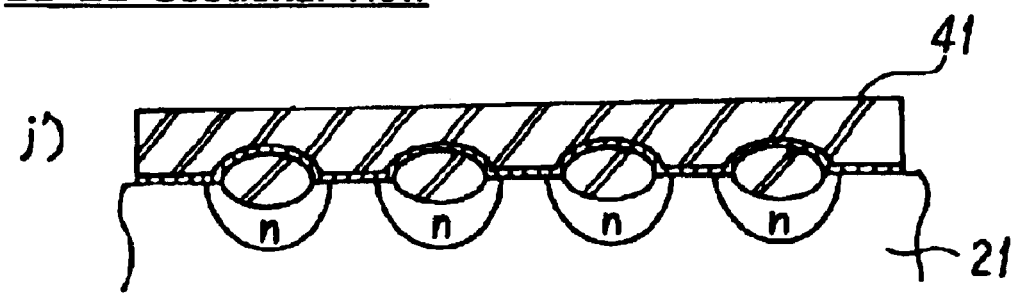

Steps f and g shown in FIG. 18 are the same as the steps shown FIG. 11. After that, the exposed first gate insulating film 30 is removed by the known dry etching method or wet etching method using the oxide film converted layer 34 as a mask, as shown in a step h in FIG. 18. The second gate insulating film 39 is formed throughout on the surface as shown in the step i in FIG. 18. As shown by the step j in FIG. 18, the second word line electrode 41 is formed whereby the polycrystalline silicon layer containing a phosphor is deposited throughout on the surface by the known CVD method and the polycrystalline silicon layer other than the groove sandwiched by the oxide film converted layer 34 and the second gate insulating film 39 is removed by the known CMP method or etch back method. Therefore, the steps i and j shown in FIG. 18 are the same as the steps i and j shown in FIG. 11. Thus, the side wall oxide film 35 can be omitted in the modified example.

Further, as a modified example, the second word line electrode 41 may be formed by forming the polycrystalline silicon layer throughout on the surface in the step i without removing the first gate insulating film 30 formed at the step g and by removing the polycrystalline silicon layer other than the groove sandwiched by the oxide film converted layers 34 by the known CMP method or etch back method. Consequently, as shown by a process j2 in FIG. 18, the gate insulating film 30 that was deposited first is utilized for both of the first and second gate insulating films as it is.

As set forth, according to the embodiments of the present invention, the non-volatile memory cell having the insulative trap gate can be formed. In addition, the word line electrode high-densely functioning as the control gate can be formed by self-alignment.

Figure 19:
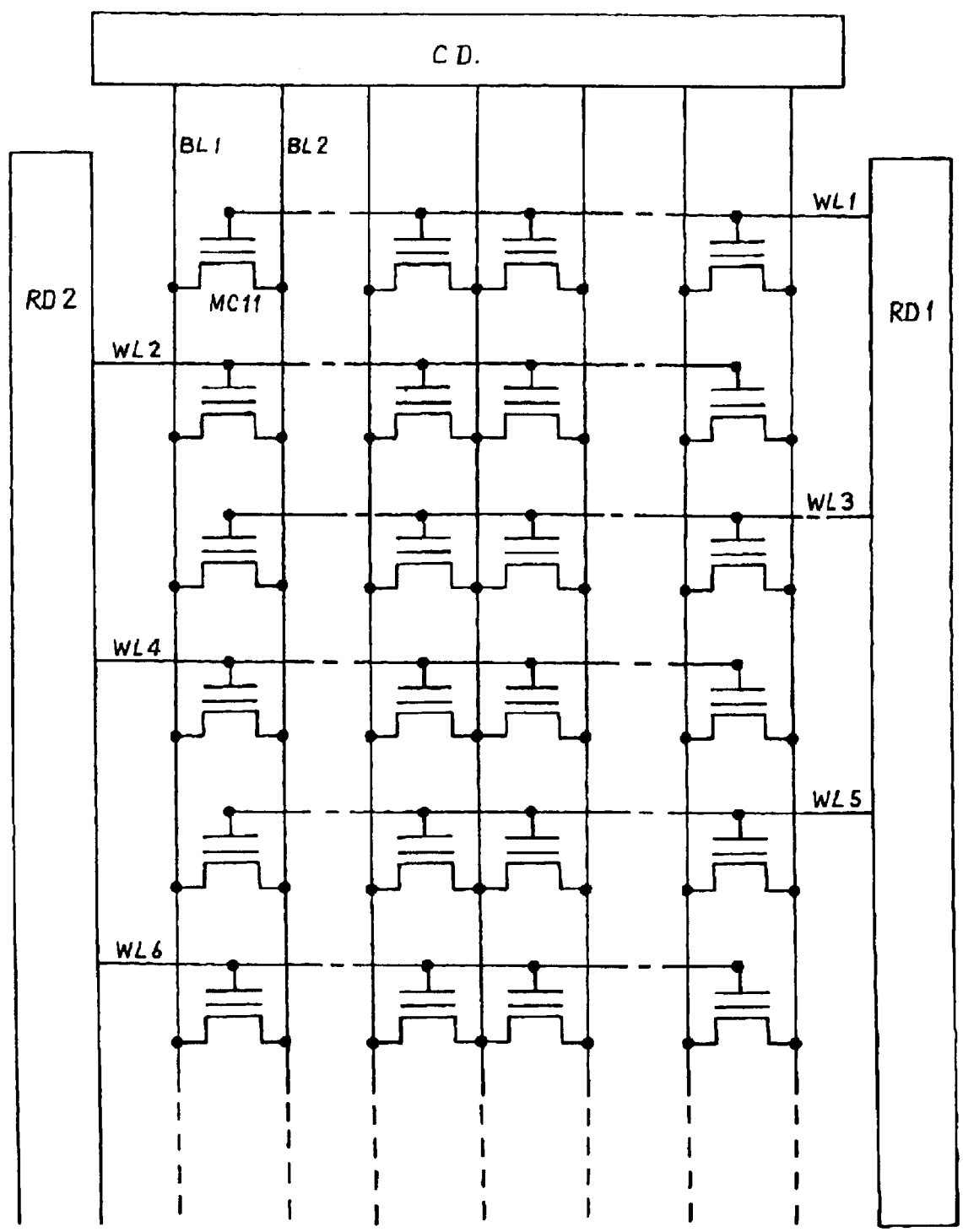
FIG. 19 is a circuit diagram showing a relationship between word line electrodes and row decoders in this embodiment.

FIG. 19 is a circuit diagram showing a relationship between the word line electrode and the row decoder in the embodiment of the present invention. In the semiconductor memory formed by the manufacturing method of the embodiment, the first and second word line electrodes are insulated through the side wall insulating film and are disposed high-densely. Accordingly, a question will be how a group of these highly dense electrodes is connected to the row decoder for selecting and driving the word line electrodes.

As shown in FIG. 19, the odd-numbered word lines WL1, WL3 and WL5 corresponding to the first word line electrode are connected to a first row decoder RD1 disposed on the right side of the memory cell array. While the even-numbered word lines WL2, WL4 and WL6 corresponding to the second word line electrode are connected to a second row decoder RD2 disposed on the left side of the memory cell array. By alternately connecting the first and second word line electrodes to the row decoders RD1 and RD2 disposed on both sides, the first and second word line electrodes disposed high-densely can be connected to the row decoders properly.

Figure 20:
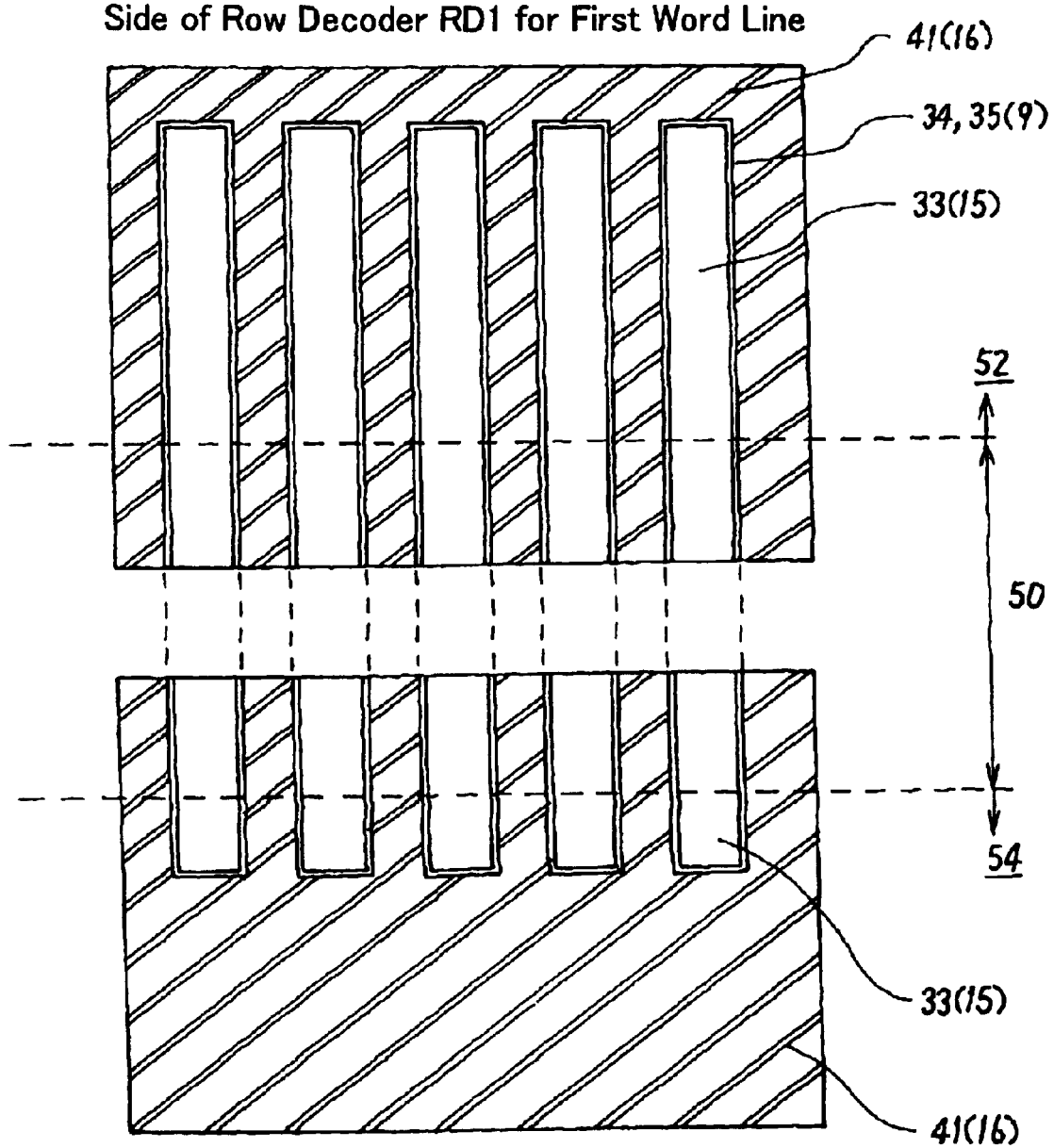
FIG. 20 is a top plan view illustrating a patterning process of a second word line electrode.

FIGS. 20–23 are a plan view illustrating a patterning process of the second word line electrode. FIG. 20 represents the state at the step k shown in FIGS. 4, 6 and 9 being completed in the first embodiment or the state at the step j shown in FIGS. 11, 13 and 15 being completed in the second embodiment. In FIG. 20, the side wall insulating films 34 and 35 (9) are formed on the side walls of the first word line electrode 33 (15) and the second word line electrode 41 (16) is embedded in the region other than the first word line electrode 33 (15). In addition, the word line electrodes extend in the vertical direction after FIG. 20 different from FIG. 19. A region 50 represents the memory cell array region, a region 52 represents the region provided with the row decoder RD1 for the first word line and a region 54 shows the region provided with the row decoder RD2 for the second word line.

Figure 21:
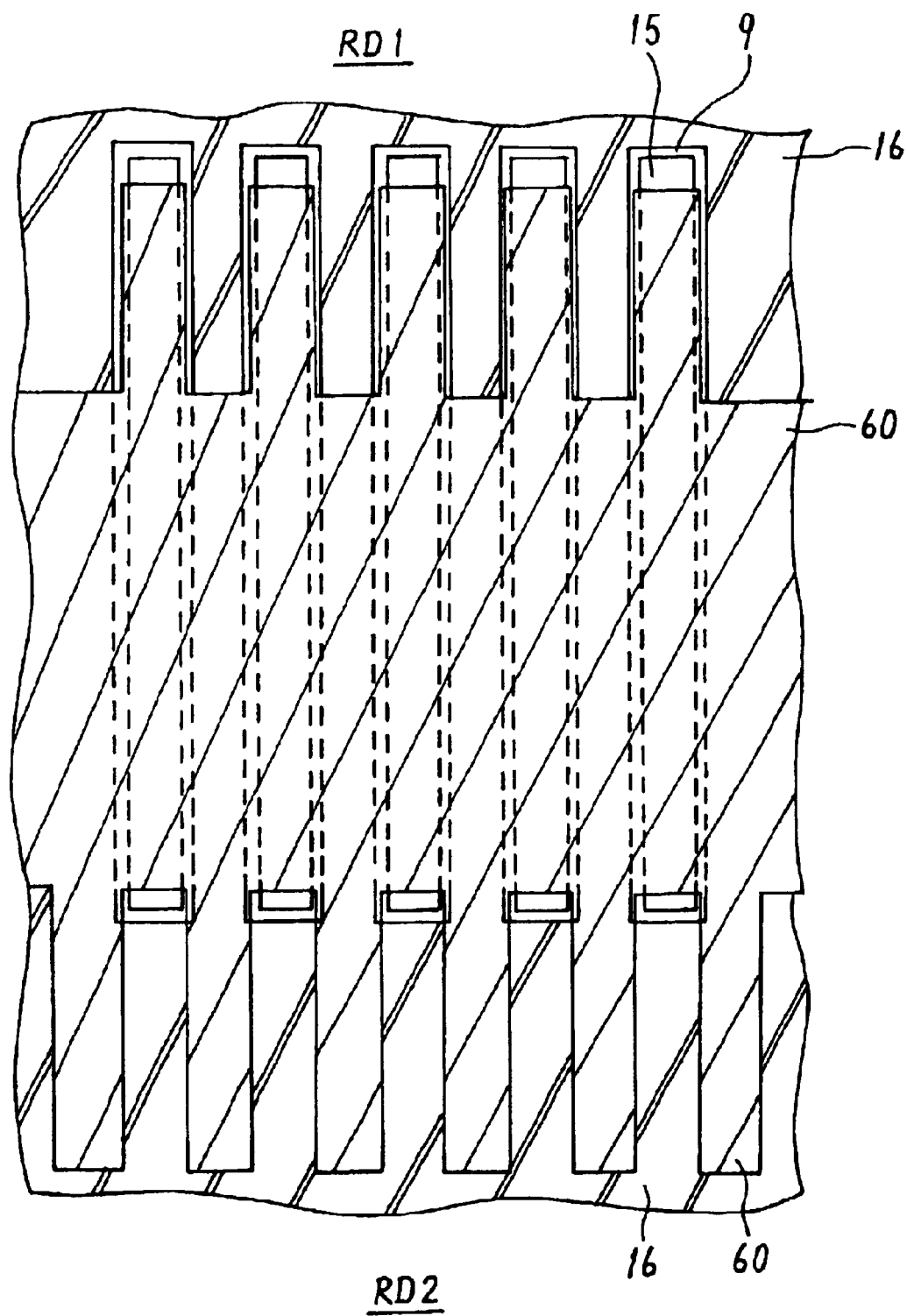
FIG. 21 is a top plan view illustrating a patterning process of the second word line electrode in the first embodiment.

FIG. 21 illustrates a mask pattern 60 for etching the second word line electrode 16 in the first embodiment. This mask pattern 60 is constructed of the photoresist. The mask pattern 60 coats the top of the first word line electrode 15 and exposes the top of the second word line electrode 16 on the first row decoder RD1 side. While the mask pattern 60 coats the region between the first word line electrodes 15 and exposes the region extending from the first word line electrodes 15 on the second row decoder RD2 side. Furthermore, in consideration of the alignment shift of the mask pattern 60 with the first word line electrodes 15 in the upper and under directions, the upper and under ends of the first word line electrodes 15 are exposed by the mask pattern 60 as shown in the figure. Thereby, even if the mask pattern 60 shifts in the upper or under direction, the second word line electrodes to be separated after etched are prevented from connecting each other.

Figure 22:
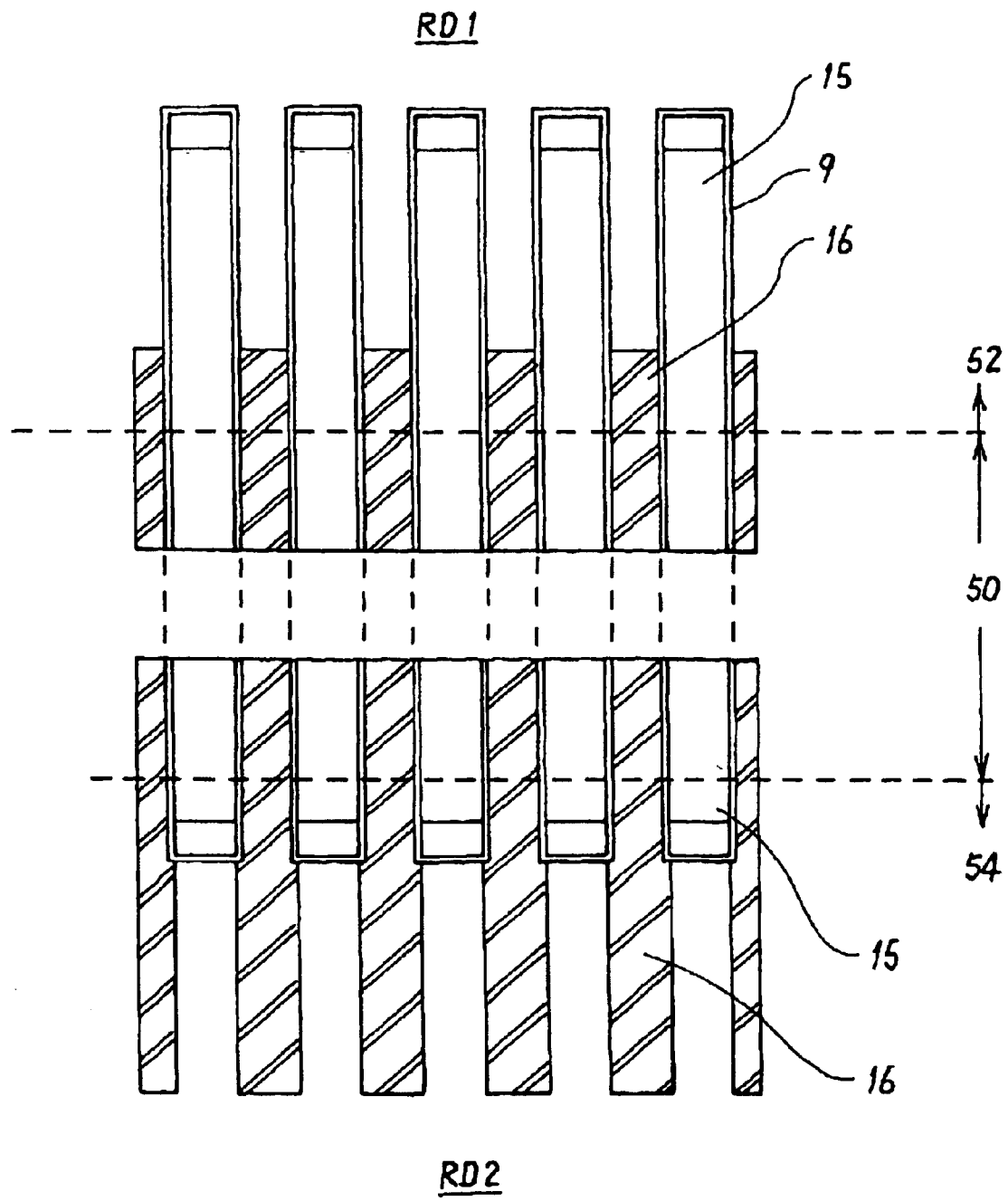
FIG. 22 is a top plan view illustrating a patterning process of the second word line electrode.

FIG. 22 is a plane view after the second word line electrode 16 has been etched by using the mask pattern 60 shown in FIG. 21. As shown in the figure, the first word line electrodes 15 extend on the first row decoder RD1 side. The second word line electrodes 16 extend on the second row decoder RD2 side. By a connecting means not shown, the first word line electrodes 15 are connected to the first row decoder RD1 disposed on the upper side in the figure and the second word line electrodes 16 are connected to the second row decoder RD2 disposed on the under side in the figure. Therefore, even if the first and second word line electrodes 15 and 16 are disposed high-densely, they can easily be connected to the row decoders RD1 and RD2. In addition, the upper and under ends of first word line electrode 15 are partially removed because they have been exposed in consideration of mask position shift.

Figure 23:
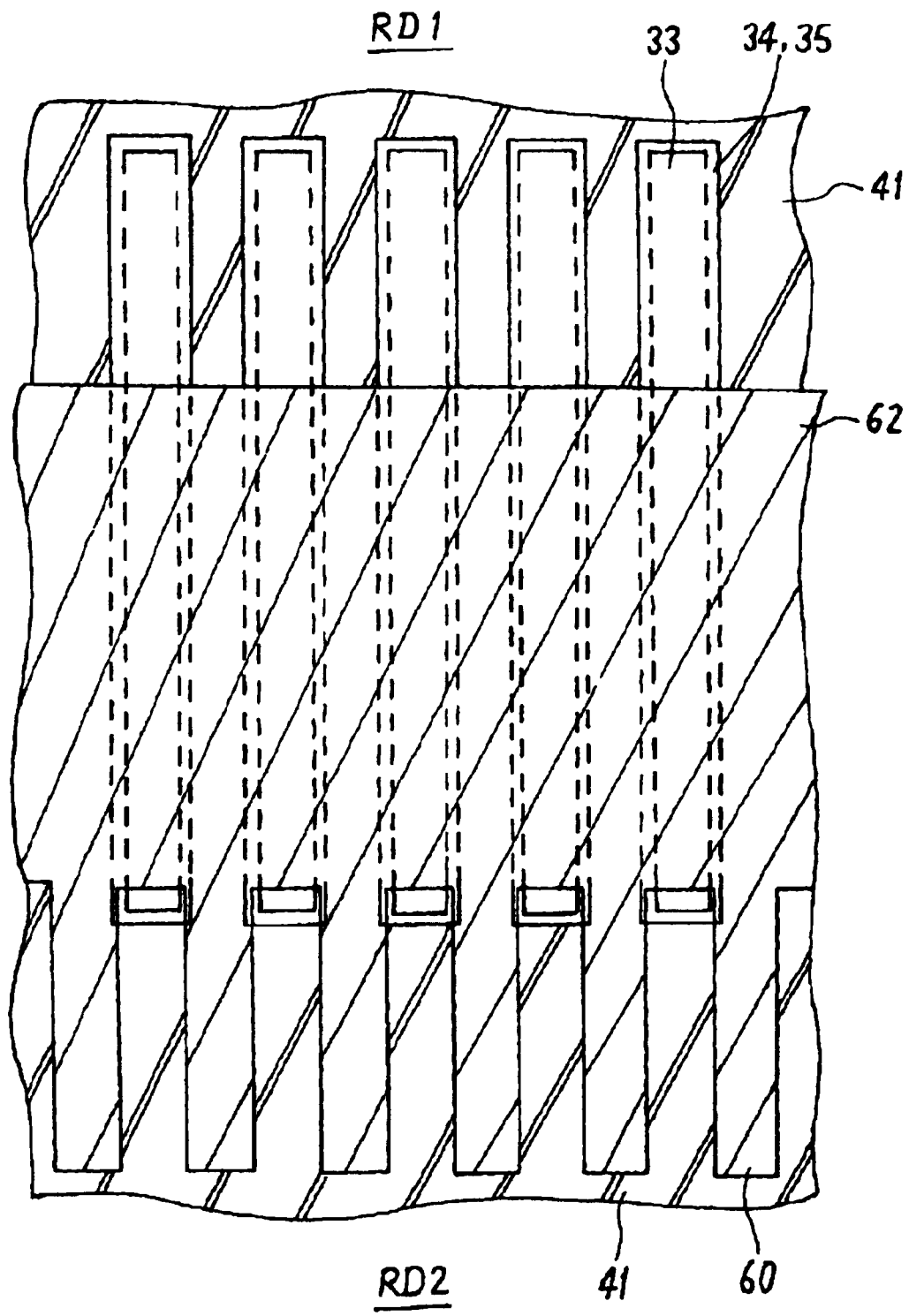
FIG. 23 is a top plan view illustrating a patterning process of the second word line electrode in the second embodiment.

FIG. 23 depicts a mask pattern 62 for etching the second word line electrode 41 in the second embodiment. This mask pattern 62 is also constructed of the photoresist. The mask pattern 62 exposes the top of the first and second word line electrodes 33 and 41 on the first row decoder RD1 side. While the mask pattern 62 coats the region between the first word line electrodes 33 and exposes the region extending from the first word line electrodes 33 on the second row decoder RD2 side. Furthermore, in consideration of the alignment shift of the mask pattern 62 with the first word line electrodes 33 in the upper and under directions, the under end of the first word line electrodes 33 is exposed as shown in the figure. Thereby, even if the mask shift is generated in the upper and under direction, the second word line electrodes to be separated after etched are prevented from connecting each other.

As shown in FIG. 11*j*, the first word line electrode 33 is covered with the silicon oxide film 34 in the second embodiment. While the second word line electrode 41 is exposed without being covered. Accordingly, the second word line electrode 41 constructed of polycrystalline silicon can be selectively etched without etching the first word line electrode 33 covered with the silicon oxide film 34 in accordance with the known etching method. Thus, the mask pattern 62 on the first row decoder RD1 side does not need to coat the top of the first word line electrodes 33.

When the second word line electrode 41 is etched by utilizing the mask pattern 62 shown in FIG. 23, the second word line electrode pattern shown in FIG. 22 can be formed. In the case of the second embodiment, the upper and under of the first word line electrode 33 are not partially removed by etching.

Other embodiments not described above will be able to form the respective end parts of the first and second word line electrodes in a comb tooth shape by extending the first word line electrode on the first row decoder RD1 side and by extending the second word line electrode on the second row decoder RD2 side. In any case, the word line electrodes disposed high-densely can be connected to the respective row decoders RD1 and RD2 relatively easily by alternately extending the word line electrodes.

According to the present invention, the non-volatile semiconductor memory having the insulative trap gate can be formed high-densely with excellent repeatability. In addition, the word line electrodes formed high-densely can be connected to row decoders properly.

The scope of the present invention to be protected is not limited by the embodiments set forth but it covers the invention defined in the appended claims and the equivalents thereof.

What is claimed is:

1. A non-volatile semiconductor memory having a plurality of memory cells with a trap gate insulating film, the non-volatile semiconductor memory comprising:
   a first memory cell array including a gate oxide film, which is formed on a substrate and has said trap gate insulating film, and first conductive word lines extending in a word line direction and formed on the gate oxide film;
   a side wall insulating film for separation disposed on both sides of said first conductive word line; and
   a second memory cell array including a gate oxide film, which is formed on said substrate and has said trap gate insulating film, and second conductive word lines formed on the gate oxide film, wherein
   said second conductive word lines are embedded between the side wall insulating films disposed on both sides of said first conductive word lines, and said first and second conductive word lines are planarized with each other.

2. The non-volatile semiconductor memory according to claim 1, wherein first and second row decoders for selecting said word line are disposed on both sides of said memory cell array in the said word line direction respectively, said first conductive word lines are connected to said first row decoder and said second conductive word lines are connected to said second row decoder.

3. The non-volatile semiconductor memory according to claim 2, wherein said first conductive word lines extend to the first row decoder side in the said first row decoder side, and said second conductive word lines extend to the second row decoder side in the said second row decoder side.

4. A non-volatile semiconductor memory having a plurality of memory cells with a trap gate insulating film, the non-volatile semiconductor memory comprising:
   a first memory cell array including a gate oxide film, which is formed on a substrate and has said trap gate insulating film, and first conductive word lines extending in a word line direction and formed on the gate oxide film;
   a thermal oxide layer for separation disposed at both sides of said first conductive word line, the thermal oxide layer being formed by thermally oxidizing the first conductive word line; and
   a second memory cell array including a gate oxide film, which is formed on said substrate and has said trap gate insulating film, and second conductive word lines formed on the gate oxide film, wherein
   said second conductive word lines are embedded between the thermal oxide layers disposed at both sides of said first conductive word lines.

* * * * *